(12) United States Patent
Pendse

(10) Patent No.: US 9,258,904 B2
(45) Date of Patent: *Feb. 9, 2016

(54) SEMICONDUCTOR DEVICE AND METHOD OF FORMING NARROW INTERCONNECT SITES ON SUBSTRATE WITH ELONGATED MASK OPENINGS

(75) Inventor: Rajendra D. Pendse, Fremont, CA (US)

(73) Assignee: STATS ChipPAC, Ltd., Singapore (SG)

( * ) Notice: Subject to any disclaimer, the term of this patent is extended or adjusted under 35 U.S.C. 154(b) by 1248 days.

This patent is subject to a terminal disclaimer.

(21) Appl. No.: 12/961,107

(22) Filed: Dec. 6, 2010

(65) Prior Publication Data

US 2011/0076809 A1 Mar. 31, 2011
US 2012/0208326 A9 Aug. 16, 2012

Related U.S. Application Data

(63) Continuation-in-part of application No. 12/362,627, filed on Jan. 30, 2009, now Pat. No. 8,278,144, which is a continuation of application No. 11/435,555, filed on May 16, 2006, now abandoned.

(60) Provisional application No. 60/594,885, filed on May 16, 2005.

(51) Int. Cl.
*H01L 21/50* (2006.01)
*H05K 3/34* (2006.01)
(Continued)

(52) U.S. Cl.
CPC ............ *H05K 3/3452* (2013.01); *H01L 21/563* (2013.01); *H01L 24/29* (2013.01);
(Continued)

(58) Field of Classification Search
CPC ..... H01L 24/10; H01L 24/81; H01L 2924/00; H01L 2224/16237; H01L 2224/83192; H01L 21/4846; H01L 23/49838; H01L 23/5386

USPC ........... 257/734, 774, 784; 438/108, 612, 107
See application file for complete search history.

(56) References Cited

U.S. PATENT DOCUMENTS 3,871,015 A 3/1975 Lin et al.
5,177,863 A 1/1993 Lam
(Continued)

FOREIGN PATENT DOCUMENTS

JP 04-355933 9/1992
JP 10-256307 9/1998
(Continued)

OTHER PUBLICATIONS

Yamada, Hiroshi et al., "Advanced copper column based solder bump for flip-chip interconnection", International Symposium on Microelectronics, 1997, pp. 417-422, The British Library—"The world's knowledge".

(Continued)

*Primary Examiner* — Michael Trinh
(74) *Attorney, Agent, or Firm* — Robert D. Atkins; Patent Law Group: Atkins and Associates, P.C.

(57) ABSTRACT

A semiconductor device has a semiconductor die with a plurality of bumps formed over a surface of the semiconductor die. A plurality of conductive traces is formed over a surface of the substrate with interconnect sites. A masking layer is formed over the surface of the substrate. The masking layer has a plurality of parallel elongated openings each exposing at least two of the conductive traces and permitting a flow of bump material along a length of the plurality of conductive traces within the plurality of elongated openings while preventing the flow of bump material past a boundary of the plurality of elongated openings. One of the conductive traces passes beneath at least two of the elongated openings. The bumps are bonded to the interconnect sites so that the bumps cover a top surface and side surface of the interconnect sites. An encapsulant is deposited around the bumps between the semiconductor die and substrate.

30 Claims, 21 Drawing Sheets

(51) Int. Cl.
*H01L 21/56* (2006.01)
*H01L 23/00* (2006.01)

(52) U.S. Cl.
CPC ............... *H01L 24/32* (2013.01); *H01L 24/81* (2013.01); *H01L 24/13* (2013.01); *H01L 24/16* (2013.01); *H01L 24/48* (2013.01); *H01L 2224/11822* (2013.01); *H01L 2224/131* (2013.01); *H01L 2224/1308* (2013.01); *H01L 2224/13082* (2013.01); *H01L 2224/13109* (2013.01); *H01L 2224/13111* (2013.01); *H01L 2224/13116* (2013.01); *H01L 2224/13144* (2013.01); *H01L 2224/13147* (2013.01); *H01L 2224/13155* (2013.01); *H01L 2224/16013* (2013.01); *H01L 2224/16014* (2013.01); *H01L 2224/16225* (2013.01); *H01L 2224/16235* (2013.01); *H01L 2224/16237* (2013.01); *H01L 2224/27013* (2013.01); *H01L 2224/2919* (2013.01); *H01L 2224/29109* (2013.01); *H01L 2224/29111* (2013.01); *H01L 2224/32145* (2013.01); *H01L 2224/48091* (2013.01); *H01L 2224/48227* (2013.01); *H01L 2224/73203* (2013.01); *H01L 2224/73204* (2013.01); *H01L 2224/73265* (2013.01); *H01L 2224/8121* (2013.01); *H01L 2224/81097* (2013.01); *H01L 2224/81191* (2013.01); *H01L 2224/81208* (2013.01); *H01L 2224/81815* (2013.01); *H01L 2224/83051* (2013.01); *H01L 2224/83192* (2013.01); *H01L 2924/00013* (2013.01); *H01L 2924/014* (2013.01); *H01L 2924/0105* (2013.01); *H01L 2924/01006* (2013.01); *H01L 2924/01013* (2013.01); *H01L 2924/01015* (2013.01); *H01L 2924/01027* (2013.01); *H01L 2924/01029* (2013.01); *H01L 2924/0132* (2013.01); *H01L 2924/0133* (2013.01); *H01L 2924/01033* (2013.01); *H01L 2924/01046* (2013.01); *H01L 2924/01047* (2013.01); *H01L 2924/01049* (2013.01); *H01L 2924/01074* (2013.01); *H01L 2924/01075* (2013.01); *H01L 2924/01078* (2013.01); *H01L 2924/01079* (2013.01); *H01L 2924/01082* (2013.01); *H01L 2924/01322* (2013.01); *H01L 2924/12041* (2013.01); *H01L 2924/1306* (2013.01); *H01L 2924/13091* (2013.01); *H01L 2924/14* (2013.01); *H01L 2924/1433* (2013.01); *H01L 2924/15311* (2013.01); *H01L 2924/181* (2013.01); *H01L 2924/19041* (2013.01); *H05K 2201/0989* (2013.01); *H05K 2201/10674* (2013.01)

(56) References Cited

U.S. PATENT DOCUMENTS

| | | | |
|---|---|---|---|
| 5,378,859 A | 1/1995 | Shirasaki et al. | |
| 5,386,624 A | 2/1995 | George et al. | |
| 5,397,864 A * | 3/1995 | Rai et al. | 174/261 |
| 5,434,410 A | 7/1995 | Kulwicki | |
| 5,508,561 A | 4/1996 | Tago et al. | |
| 5,517,756 A | 5/1996 | Shirai et al. | |
| 5,519,580 A | 5/1996 | Natarajan et al. | |
| 5,569,964 A * | 10/1996 | Ikebe | 257/780 |
| 5,650,595 A | 7/1997 | Bentlage et al. | |
| 5,710,071 A | 1/1998 | Beddingfield et al. | |
| 5,798,285 A * | 8/1998 | Bentlage et al. | 438/108 |
| 5,844,782 A | 12/1998 | Fukasawa | |
| 5,869,886 A | 2/1999 | Tokuno | |
| 5,872,399 A | 2/1999 | Lee | |
| 5,889,326 A | 3/1999 | Tanaka | |
| 5,915,169 A | 6/1999 | Heo | |
| 5,925,445 A * | 7/1999 | Suzuki | 428/209 |
| 5,985,456 A | 11/1999 | Zhou et al. | |
| 6,030,889 A | 2/2000 | Aulicino et al. | |
| 6,049,122 A | 4/2000 | Yoneda | |
| 6,111,317 A | 8/2000 | Okada et al. | |
| 6,133,637 A | 10/2000 | Hikita et al. | |
| 6,201,305 B1 | 3/2001 | Darveaux et al. | |
| 6,218,630 B1 | 4/2001 | Takigami | |
| 6,228,466 B1 | 5/2001 | Tsukada et al. | |
| 6,229,711 B1 | 5/2001 | Yoneda | |
| 6,259,163 B1 | 7/2001 | Ohuchi et al. | |
| 6,281,450 B1 | 8/2001 | Urasaki et al. | |
| 6,297,560 B1 | 10/2001 | Capote et al. | |
| 6,324,754 B1 | 12/2001 | DiStefano et al. | |
| 6,329,605 B1 | 12/2001 | Beroz et al. | |
| 6,335,568 B1 | 1/2002 | Yuzawa et al. | |
| 6,335,571 B1 | 1/2002 | Capote et al. | |
| 6,396,707 B1 | 5/2002 | Huang et al. | |
| 6,409,073 B1 | 6/2002 | Kaskoun et al. | |
| 6,441,316 B1 | 8/2002 | Kusui | |
| 6,448,665 B1 | 9/2002 | Nakazawa et al. | |
| 6,573,610 B1 | 6/2003 | Tsai | |
| 6,600,234 B2 | 7/2003 | Kuwabara et al. | |
| 6,608,388 B2 | 8/2003 | Lin et al. | |
| 6,710,458 B2 | 3/2004 | Seko | |
| 6,734,557 B2 | 5/2004 | Taniguchi et al. | |
| 6,774,497 B1 | 8/2004 | Qi et al. | |
| 6,780,673 B2 | 8/2004 | Venkateswaran | |
| 6,787,918 B1 | 9/2004 | Tsai et al. | |
| 6,791,186 B2 | 9/2004 | Sorimachi et al. | |
| 6,809,262 B1 | 10/2004 | Hsu | |
| 6,818,545 B2 | 11/2004 | Lee et al. | |
| 6,849,944 B2 | 2/2005 | Murtuza et al. | |
| 6,870,276 B1 | 3/2005 | Moxham et al. | |
| 6,888,255 B2 | 5/2005 | Murtuza et al. | |
| 6,913,948 B2 | 7/2005 | Caletka et al. | |
| 6,916,685 B2 | 7/2005 | Yang et al. | |
| 6,916,995 B2 | 7/2005 | Seaman et al. | |
| 7,005,585 B2 | 2/2006 | Ishizaki | |
| 7,005,750 B2 | 2/2006 | Liu | |
| 7,049,705 B2 | 5/2006 | Huang | |
| 7,057,284 B2 | 6/2006 | Chauhan et al. | |
| 7,064,435 B2 | 6/2006 | Chung et al. | |
| 7,098,407 B2 | 8/2006 | Kim et al. | |
| 7,102,239 B2 | 9/2006 | Pu et al. | |
| 7,173,828 B2 | 2/2007 | Lin et al. | |
| 7,224,073 B2 | 5/2007 | Kim | |
| 7,242,099 B2 | 7/2007 | Lin et al. | |
| 7,271,484 B2 | 9/2007 | Reiss et al. | |
| 7,294,929 B2 | 11/2007 | Miyazaki | |
| 7,317,245 B1 | 1/2008 | Lee et al. | |
| 7,405,484 B2 | 7/2008 | Usui et al. | |
| 7,436,063 B2 | 10/2008 | Miyata et al. | |
| 7,521,284 B2 | 4/2009 | Miranda et al. | |
| 7,642,660 B2 | 1/2010 | Tay et al. | |
| 7,670,939 B2 | 3/2010 | Topacio et al. | |
| 7,671,454 B2 | 3/2010 | Seko | |
| 7,732,913 B2 | 6/2010 | Hsieh et al. | |
| 7,750,457 B2 | 7/2010 | Seko | |
| 7,790,509 B2 | 9/2010 | Gerber | |
| 7,791,211 B2 | 9/2010 | Chen et al. | |
| 7,847,399 B2 | 12/2010 | Masumoto | |
| 7,847,417 B2 | 12/2010 | Araki et al. | |
| 7,851,928 B2 | 12/2010 | Gallegos et al. | |
| 7,898,083 B2 | 3/2011 | Castro | |
| 7,902,660 B1 | 3/2011 | Lee et al. | |
| 7,902,678 B2 | 3/2011 | Ohuchi et al. | |
| 7,902,679 B2 | 3/2011 | Lin et al. | |
| 7,932,170 B1 | 4/2011 | Huemoeller et al. | |
| 7,947,602 B2 | 5/2011 | Ito et al. | |
| 8,278,144 B2 * | 10/2012 | Pendse | 438/108 |
| 2002/0162684 A1 | 11/2002 | Sorimachi et al. | |
| 2003/0164551 A1 * | 9/2003 | Lee et al. | 257/778 |
| 2004/0040742 A1 | 3/2004 | Ishizaki | |
| 2004/0056341 A1 | 3/2004 | Endo et al. | |
| 2004/0159957 A1 | 8/2004 | Lee | |
| 2004/0212969 A1 * | 10/2004 | Imamura et al. | 361/760 |

(56) References Cited

U.S. PATENT DOCUMENTS

| | | |
|---|---|---|
| 2004/0219713 A1* | 11/2004 | Lee ............................... 438/106 |
| 2004/0232562 A1 | 11/2004 | Hortaleza et al. |
| 2005/0062149 A1 | 3/2005 | Karnezos et al. |
| 2005/0103516 A1 | 5/2005 | Kaneyuki |
| 2005/0248037 A1 | 11/2005 | Hung et al. |
| 2005/0258544 A1 | 11/2005 | Kim |
| 2006/0033210 A1* | 2/2006 | Chauhan et al. ............. 257/737 |
| 2006/0131758 A1 | 6/2006 | Dao |
| 2007/0096291 A1 | 5/2007 | Kawabata et al. |
| 2007/0200234 A1 | 8/2007 | Gerber et al. |
| 2008/0093749 A1 | 4/2008 | Gerber et al. |
| 2008/0179740 A1 | 7/2008 | Liao |
| 2008/0277802 A1 | 11/2008 | Tsai et al. |
| 2009/0108445 A1 | 4/2009 | Liang |
| 2009/0114436 A1 | 5/2009 | Chen et al. |
| 2009/0152716 A1 | 6/2009 | Sohara |
| 2009/0191329 A1 | 7/2009 | Wang |
| 2009/0288866 A1 | 11/2009 | Tsai et al. |
| 2009/0308647 A1 | 12/2009 | Liao |
| 2010/0139965 A1 | 6/2010 | Wang et al. |
| 2010/0176510 A1 | 7/2010 | Pendse |
| 2011/0049703 A1 | 3/2011 | Hsu et al. |

FOREIGN PATENT DOCUMENTS

| | | |
|---|---|---|
| JP | 2000-031204 | 1/2000 |
| JP | 2004-221205 | 5/2004 |
| JP | 2007123466 A | 5/2007 |

OTHER PUBLICATIONS

Yamada, Hiroshi et al., "A fine pitch and high aspect ratio bump array for flip-chip interconnection", Int'l Electronics Manufacturing Technology Symposium, 1992, pp. 288-292, IEEE/CHMT.

Son, Ho Young et al., "Studies on the Thermal Cycling Reliability of Fine Pitch Cu/SnAg Double-Bump Flip Chip Assemblies on Organic Substrates: Experimental Results and Numerical Analysis", Electronic Components and Technology Conference, 2008, pp. 2035-2043.

Lu, H. et al., "Predicting Optimal Process Conditions for Flip-Chip Assembly Using Copper Column Bumped Dies", Electronics Packaging Technology Conference, 2002, pp. 338-343.

Kawahara, Toshimi, "SuperCSP", IEEE Transactions on Advanced Packaging, May 2000, pp. 215-219, vol. 23, No. 2.

* cited by examiner

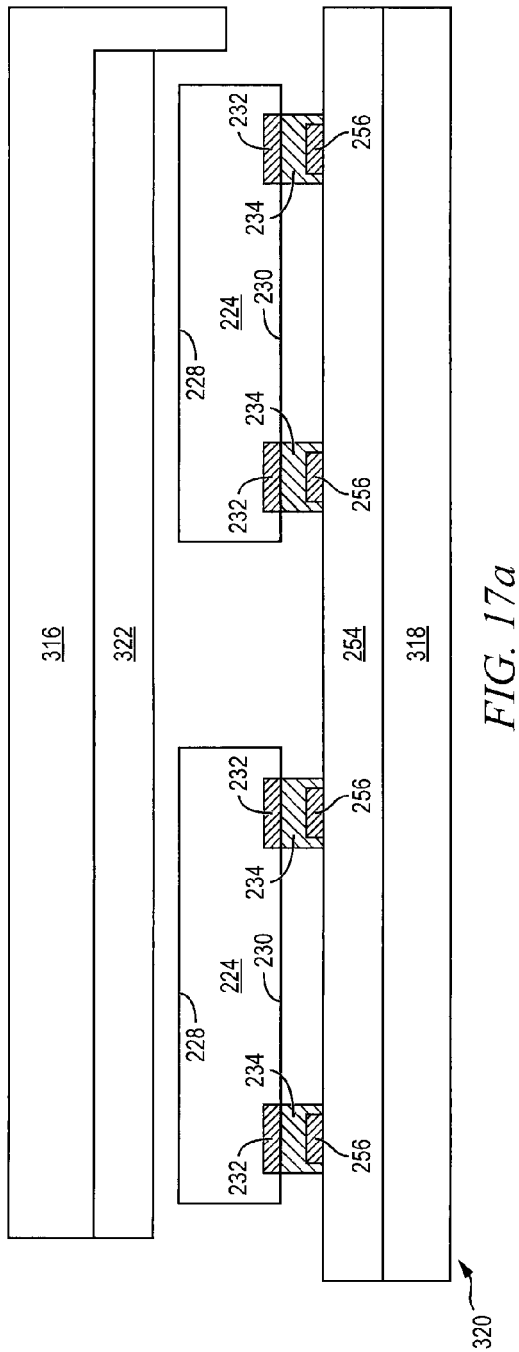
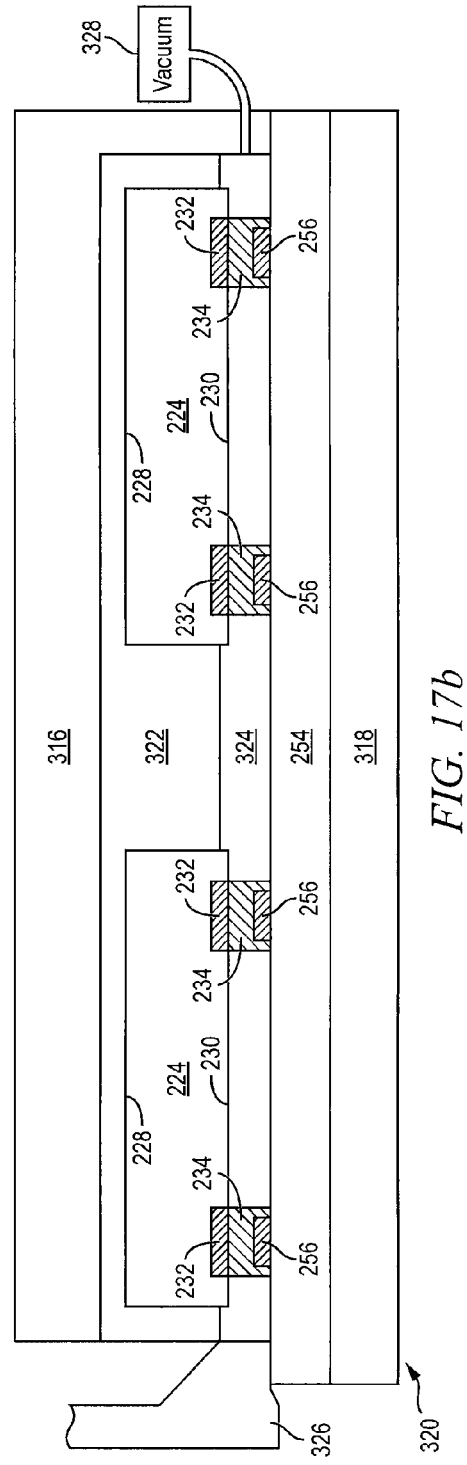

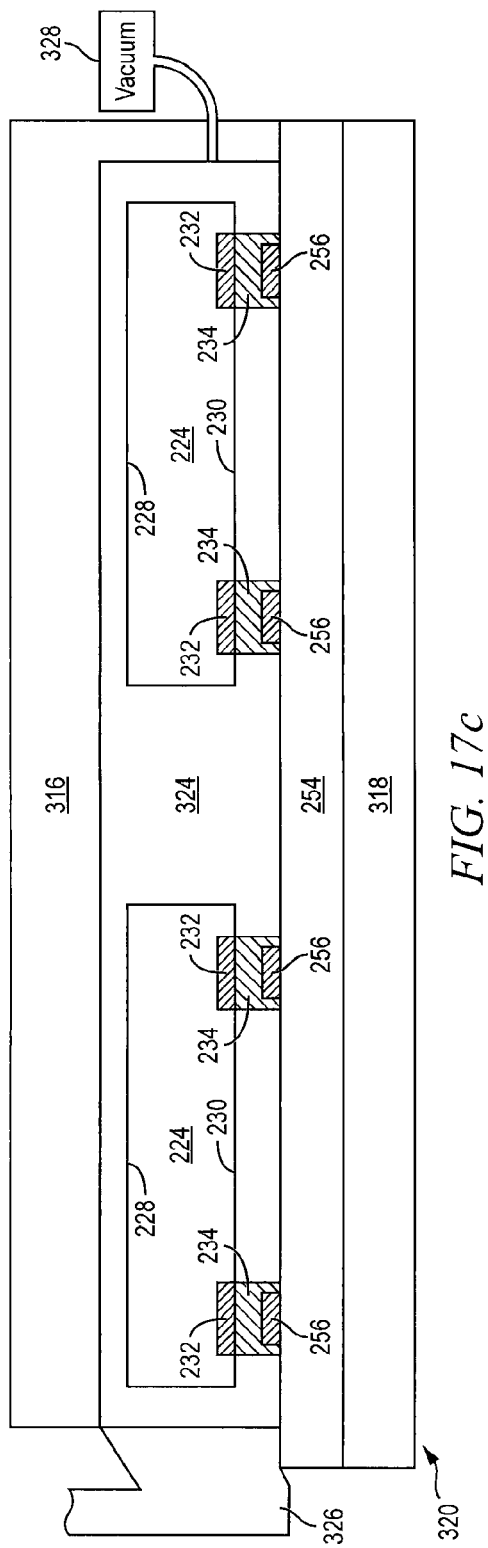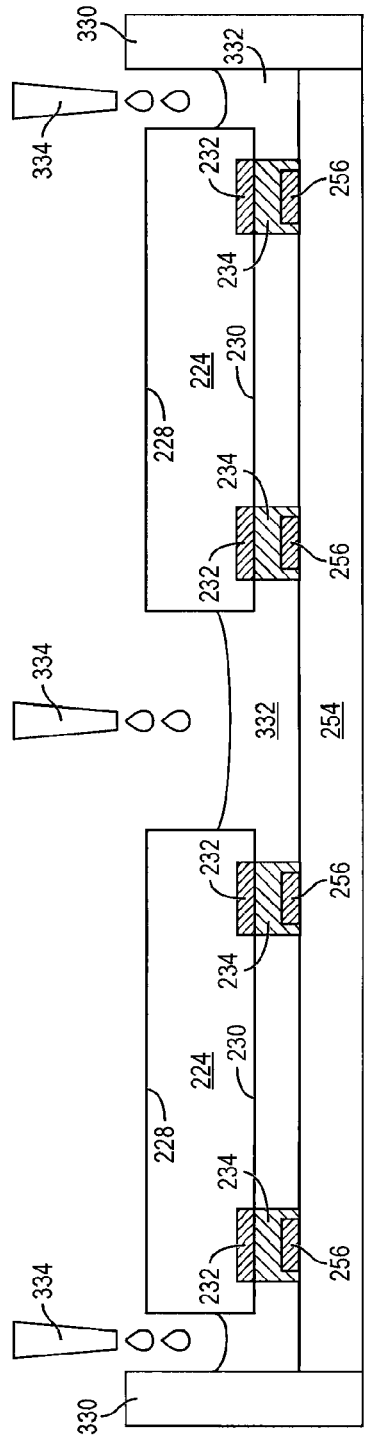

US 9,258,904 B2

SEMICONDUCTOR DEVICE AND METHOD OF FORMING NARROW INTERCONNECT SITES ON SUBSTRATE WITH ELONGATED MASK OPENINGS

CLAIM TO DOMESTIC PRIORITY

The present application is a continuation-in-part of U.S. patent application Ser. No. 12/362,627, now U.S. Pat. No. 8,278,144, filed Jan. 30, 2009, which is a continuation of U.S. patent application Ser. No. 11/435,555, filed May 16, 2006, now abandoned, which claims the benefit of U.S. Provisional Application No. 60/594,885, filed May 16, 2005.

FIELD OF THE INVENTION

The present invention relates to semiconductor devices and, particularly, to a semiconductor device and method of forming narrow interconnect sites on a substrate with elongated mask openings.

BACKGROUND OF THE INVENTION

Semiconductor devices are commonly found in modern electronic products. Semiconductor devices vary in the number and density of electrical components. Discrete semiconductor devices generally contain one type of electrical component, e.g., light emitting diode (LED), small signal transistor, resistor, capacitor, inductor, and power metal oxide semiconductor field effect transistor (MOSFET). Integrated semiconductor devices typically contain hundreds to millions of electrical components. Examples of integrated semiconductor devices include microcontrollers, microprocessors, charged-coupled devices (CCDs), solar cells, and digital micro-mirror devices (DMDs).

Semiconductor devices perform a wide range of functions such as signal processing, high-speed calculations, transmitting and receiving electromagnetic signals, controlling electronic devices, transforming sunlight to electricity, and creating visual projections for television displays. Semiconductor devices are found in the fields of entertainment, communications, power conversion, networks, computers, and consumer products. Semiconductor devices are also found in military applications, aviation, automotive, industrial controllers, and office equipment.

Semiconductor devices exploit the electrical properties of semiconductor materials. The atomic structure of semiconductor material allows its electrical conductivity to be manipulated by the application of an electric field or base current or through the process of doping. Doping introduces impurities into the semiconductor material to manipulate and control the conductivity of the semiconductor device.

A semiconductor device contains active and passive electrical structures. Active structures, including bipolar and field effect transistors, control the flow of electrical current. By varying levels of doping and application of an electric field or base current, the transistor either promotes or restricts the flow of electrical current. Passive structures, including resistors, capacitors, and inductors, create a relationship between voltage and current necessary to perform a variety of electrical functions. The passive and active structures are electrically connected to form circuits, which enable the semiconductor device to perform high-speed calculations and other useful functions.

Semiconductor devices are generally manufactured using two complex manufacturing processes, i.e., front-end manufacturing, and back-end manufacturing, each involving potentially hundreds of steps. Front-end manufacturing involves the formation of a plurality of die on the surface of a semiconductor wafer. Each die is typically identical and contains circuits formed by electrically connecting active and passive components. Back-end manufacturing involves singulating individual die from the finished wafer and packaging the die to provide structural support and environmental isolation.

One goal of semiconductor manufacturing is to produce smaller semiconductor devices. Smaller devices typically consume less power, have higher performance, and can be produced more efficiently. In addition, smaller semiconductor devices have a smaller footprint, which is desirable for smaller end products. A smaller die size can be achieved by improvements in the front-end process resulting in die with smaller, higher density active and passive components. Back-end processes may result in semiconductor device packages with a smaller footprint by improvements in electrical interconnection and packaging materials.

In conventional flipchip type packages, a semiconductor die is mounted to a package substrate with the active side of the die facing the substrate. Conventionally, the interconnection of the circuitry in the semiconductor die with circuitry in the substrate is made by way of bumps which are attached to an array of interconnect pads on the die and bonded to a corresponding complementary array of interconnect pads, often referred to as capture pads on the substrate.

The areal density of electronic features on integrated circuits has increased enormously, and a semiconductor die having a greater density of circuit features also may have a greater density of sites for interconnection with the package substrate.

The package is connected to underlying circuitry, such as a printed circuit board or motherboard, by way of second level interconnects between the package and underlying circuit. The second level interconnects have a greater pitch than the flipchip interconnects, and so the routing on the substrate conventionally fans out. Significant technological advances have enabled construction of fine lines and spaces. In the conventional arrangement, space between adjacent pads limits the number of traces than can escape from the more inward capture pads in the array. The fan-out routing between the capture pads beneath the semiconductor die and external pins of the package is formed on multiple metal layers within the package substrate. For a complex interconnect array, substrates having multiple layers can be required to achieve routing between the die pads and second level interconnects on the package.

Multiple layer substrates are expensive and, in conventional flipchip constructs, the substrate alone typically accounts for more than half the package cost. The high cost of multilayer substrates has been a factor in limiting proliferation of flipchip technology in mainstream products. The escape routing pattern typically introduces additional electrical parasitics because the routing includes short runs of unshielded wiring and vias between wiring layers in the signal transmission path. Electrical parasitics can significantly limit package performance.

In some conventional processes, a flipchip interconnect is made by contacting the bumps or balls on the semiconductor die with corresponding interconnect sites on the substrate circuitry, and then heating to reflow the fusible portion of the solder bumps or to reflow the solder bumps in their entirety to make the electrical connection. In such processes, the melted solder may flow from the interconnect site along the metal of the circuitry, depleting the solder at the connection site and, where the bumps are collapsible under reflow conditions, the bumps may contact adjacent circuitry or nearby bumps, resulting in electrical failure. To avoid these problems, the solder is confined by a solder mask formed as a layer of dielectric material overlying the patterned metal layer at the die mount surface of the substrate with an opening exposing an interconnect site on the underlying circuitry. Process limitations in patterning the solder mask prevent reliably forming well-aligned and consistently dimensioned openings and, accordingly, where a solder mask is employed, substrates having fine circuitry feature dimensions as would be required for finer pitch interconnection are not attainable.

The interconnect pitch in a conventional flipchip interconnect is limited in part by the dimensions of the capture pads on the substrate. The capture pads are typically much wider than the connecting circuit elements. Recently, flipchip substrate circuitry designs have been disclosed, in which reliable interconnection is made on narrow circuit elements on the substrate, as bond-on-narrow pad (BONP) interconnections described in U.S. patent publication 20060216860, and as bump-on-lead (BOL) interconnections described in U.S. patent publication 20050110164, both incorporated by reference. Where a conventional solder mask is employed, limitations in the process for patterning the solder mask can limit pitch reduction even in some BONP or BOL substrate configurations. The exposed bondable surface of the lead may be contaminated by or covered by solder mask residue, resulting in an imperfect solder joint. The bondable surface of the lead may be inconsistently or only partially exposed at the interconnect site, resulting in an unreliable and inconsistent trace structure.

The conventional flipchip interconnection is made by using a melting process to join the bumps onto mating surfaces of corresponding interconnect sites on the patterned metal layer at the die attach surface of the substrate. Where the site is a capture pad, the interconnect is known as a bump-on-capture pad (BOC) interconnect. Where the site is a lead or narrow pad, the interconnect is known as a BOL or BONP interconnect. In the BOC design, a comparatively large capture pad is required to mate with the bump on the semiconductor die. In some flipchip interconnections, an insulating material or solder mask is required to confine the flow of solder during the interconnection process. The solder mask opening defines the contour of the melted solder at the capture pad, i.e., solder mask defined, or the solder contour may not be defined by the mask opening, i.e., non-solder mask defined. In the latter case, the solder mask opening is significantly larger than the capture pad. Since the techniques for defining solder mask openings have wide tolerance ranges for a solder mask defined bump configuration, the capture pad must be large, typically considerably larger than the design size for the mask opening, to ensure that the mask opening is located on the mating surface of the pad. For a non-solder mask defined bump configuration, the solder mask opening must be larger than the capture pad. The width or diameter of capture pads can be as much as two to four times wider than the trace width. The larger width of the capture pads results in considerable loss of routing space on the top substrate layer. In particular, the escape routing pitch is much larger than the finest trace pitch that the substrate technology can offer. A significant number of pads must be routed on lower substrate layers by means of short stubs and vias, often beneath the footprint of the die, emanating from the pads in question.

FIGS. 1-3 show aspects of a conventional flipchip interconnection using a solder mask. FIG. 1 shows substrate 12 in a diagrammatic sectional view or plan view taken in a plane parallel to the substrate surface. Certain features are shown as if transparent. Substrate 12 includes a dielectric layer, supporting a metal layer at the die attach surface, patterned to form circuitry underlying the solder mask. The circuitry includes leads or traces 15 exposed at interconnect sites 19 by openings 18 in solder mask 16, as shown in FIG. 2. The conventional solder mask can have a nominal mask opening diameter in the range of 80 to 90 micrometers (µm). Solder mask materials can be resolved at such pitches and, particularly, substrates can be made comparatively inexpensively with solder masks having 90 µm openings and alignment tolerances plus or minus 25 µm. In some embodiments, laminate substrates made according to standard design rules, such as 4-metal layer laminates, are used. Traces 15 have a 90 µm pitch and the narrow pads are located in a 270 µm area array providing an effective escape pitch about 90 µm across the edge of the die footprint, indicated by broken line 11.

In FIG. 3, the interconnection of semiconductor die 34 onto substrate 12 is achieved by mating bumps 35 directly onto interconnect sites 19 on narrow leads or traces 15 patterned on a dielectric layer on the die attach surface of substrate 12. In this example there is no pad, and solder mask 16 serves to limit flow of solder within the bounds of mask openings 18, preventing solder flow away from the interconnect site along the solder-wettable lead. The solder mask also confines flow of molten solder between leads in the course of the assembly process. However, the density of flipchip interconnection in which a solder mask is desired is limited by process capability of the solder mask patterning process.

An underfill material 37 between the active side of semiconductor die 34 and solder mask 16 over substrate 12 protects the interconnections and mechanically stabilizes the assembly. Underfill material 37 can be a curable resin plus a filler, which is typically a fine particulate material such as silica or alumina particles. The particular resin and filler, as well as the proportion of filler in the resin, are selected to provide suitable mechanical and adhesion properties to underfill material 37, both during processing and in the resulting underfill. Underfill material 37 is formed after the interconnection has been made between interconnect sites 19 on substrate 12 and bumps 35 on semiconductor die 34 by applying the underfill material in a liquid form to the narrow space between the die and substrate near an edge of the die. Underfill material 37 is permitted to flow by capillary action into the space, referred to as capillary underfill. Alternatively, underfill material 37 is deposited by applying a quantity of the underfill material to the active side of semiconductor die 34 or to solder mask 16 over substrate 12, then moving the die toward the substrate and pressing bumps 35 against interconnect sites 19, referred to as no-flow underfill.

FIGS. 4 and 5 show aspects of a conventional flipchip interconnection without using a solder mask. FIG. 4 shows a package assembly, in a diagrammatic partial sectional view taken in a plane parallel to the substrate surface, along the lines 4-4' in FIG. 5. Certain features are shown as if transparent. FIG. 5 shows a partial sectional view of a package as in FIG. 4, taken in a plane perpendicular to the plane of the package substrate surface, along line 5-5' in FIG. 4.

FIG. 4 shows an escape routing pattern for substrate 42 arranged for the semiconductor die on which the die attach pads are located in an array of parallel rows near the die perimeter. The patterned traces or leads 43 are routed according to a pattern complementary to the arrangement of bumps 45 on the semiconductor die. The BOL interconnection is achieved by mating bumps 45 directly onto respective interconnect sites 40 of narrow leads or traces 43 on substrate 42 in a complementary array near the edge of the die footprint, indicated by broken line 41. The leads 43 are formed by patterning a metal layer on a die attach surface of substrate dielectric layer 42. The electrical interconnection of semiconductor die 46 is made by joining bumps 45 formed on interconnect pads on the active side of the die onto interconnect sites 40, as shown in FIG. 5. Certain ones of escape traces 43 pass between bumps 45 and are routed across substrate 42 in rows toward the interior of the die footprint.

Without a solder mask, the molten bump material can be confined by a non-collapsible bump with solder on the interconnect site. Alternatively, an encapsulating resin adhesive is employed in a no-flow underfill process to confine the solder flow during the melt phase of the interconnection process. The no-flow underfill material is applied before semiconductor die 46 and substrate 42 are brought together. The no-flow underfill material is displaced by the approach of bumps 45 onto interconnect sites 40, and by the opposed surfaces of the die and the substrate. The adhesive for the no-flow underfill material can be a fast-gelling adhesive or other material that gels sufficiently at the gel temperature in a time period in the order of 1-2 seconds.

SUMMARY OF THE INVENTION

A need exists to minimize escape pitch of trace lines for higher routing density. Accordingly, in one embodiment, the present invention is a method of making a semiconductor device comprising the steps of providing a semiconductor die having a plurality of bumps formed over a surface of the semiconductor die, providing a substrate, forming a plurality of conductive traces over a surface of the substrate with interconnect sites, and forming a masking layer over the surface of the substrate. The masking layer has a plurality of parallel elongated openings each exposing at least two of the conductive traces and permitting a flow of bump material along a length of the plurality of conductive traces within the plurality of elongated openings while preventing the flow of bump material past a boundary of the plurality of elongated openings. The method further includes the steps of bonding the bumps to the interconnect sites so that the bumps cover a top surface and side surface of the interconnect sites, and depositing an encapsulant around the bumps between the semiconductor die and substrate.

In another embodiment, the present invention is a method of making a semiconductor device comprising the steps of providing a semiconductor die, providing a substrate, forming a plurality of conductive traces over a surface of the substrate with interconnect sites, forming a masking layer over the surface of the substrate, forming a plurality of interconnect structures between the semiconductor die and the interconnect sites of the substrate, and depositing an encapsulant between the semiconductor die and substrate. The solder mask has a plurality of elongated openings exposing at least two of the conductive traces.

In another embodiment, the present invention is a method of making a semiconductor device comprising the steps of providing a semiconductor die, providing a substrate, forming a plurality of conductive traces over a surface of the substrate with interconnect sites, forming a masking layer over the surface of the substrate, and forming a plurality of interconnect structures between the semiconductor die and the interconnect sites of the substrate so that the interconnect structures cover a top surface and side surface of the interconnect sites. The solder mask has a plurality of elongated openings exposing at least two of the conductive traces.

In another embodiment, the present invention is a semiconductor device comprising a semiconductor die and substrate having a plurality of conductive traces formed over a surface of the substrate with interconnect sites. A masking layer is formed over the surface of the substrate. The masking layer has a plurality of elongated openings exposing at least two of the conductive traces. A plurality of interconnect structures is formed between the semiconductor die and the interconnect sites of the substrate. An encapsulant is deposited between the semiconductor die and substrate.

BRIEF DESCRIPTION OF THE DRAWINGS

FIGS. 17a-17c illustrate mold underfill between the semiconductor die and substrate;

FIG. 18 illustrates another mold underfill between the semiconductor die and substrate;

DETAILED DESCRIPTION OF THE DRAWINGS

Figure 1:
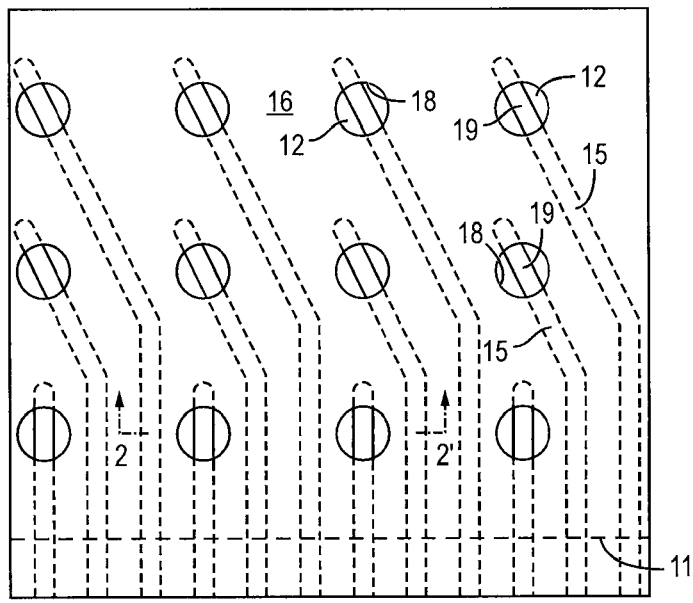
FIG. 1 illustrates a conventional flipchip package substrate with a solder mask parallel to a plane of the package substrate surface.
Figure 2:
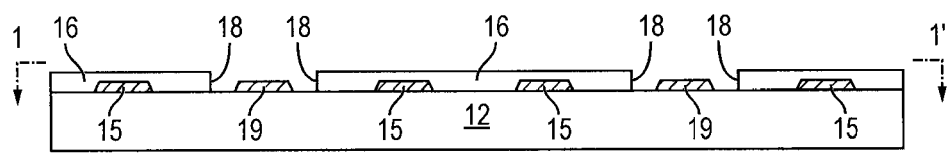
FIG. 2 illustrates a conventional flipchip package substrate with a solder mask perpendicular to a plane of the package substrate surface.
Figure 3:
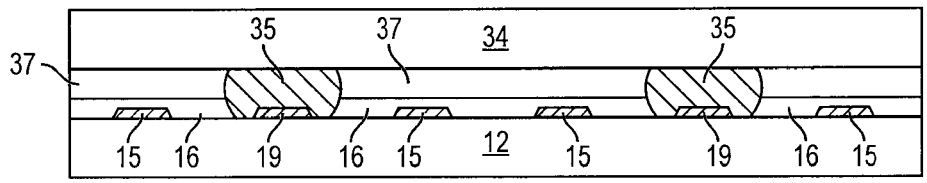
FIG. 3 illustrates a conventional flipchip assembly with a semiconductor die interconnected on a substrate.
Figure 4:
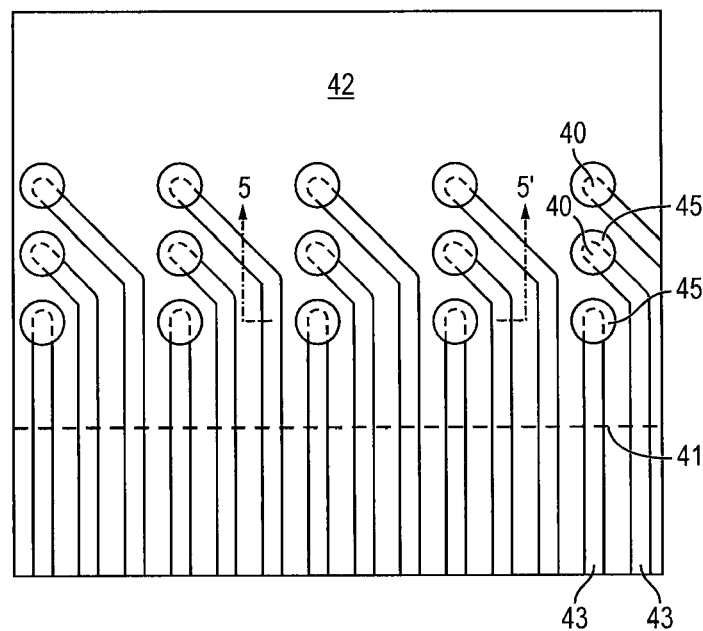
FIG. 4 illustrates a conventional flipchip interconnection of a semiconductor die on a substrate without a solder mask.
Figure 5:
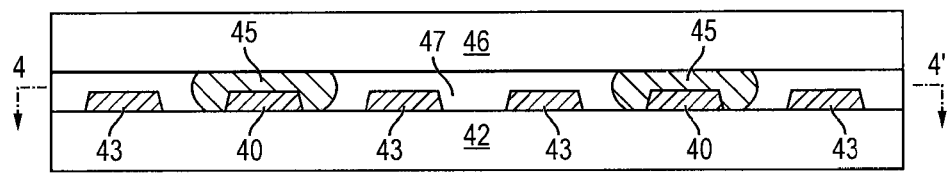
FIG. 5 illustrates the semiconductor die mounted to the substrate without a solder mask as in FIG. 4.

The present invention is described in one or more embodiments in the following description with reference to the figures, in which like numerals represent the same or similar elements. While the invention is described in terms of the best mode for achieving the invention's objectives, it will be appreciated by those skilled in the art that it is intended to cover alternatives, modifications, and equivalents as can be included within the spirit and scope of the invention as defined by the appended claims and their equivalents as supported by the following disclosure and drawings.

Semiconductor devices are generally manufactured using two complex manufacturing processes: front-end manufacturing and back-end manufacturing. Front-end manufacturing involves the formation of a plurality of die on the surface of a semiconductor wafer. Each die on the wafer contains active and passive electrical components, which are electrically connected to form functional electrical circuits. Active electrical components, such as transistors and diodes, have the ability to control the flow of electrical current. Passive electrical components, such as capacitors, inductors, resistors, and transformers, create a relationship between voltage and current necessary to perform electrical circuit functions.

Passive and active components are formed over the surface of the semiconductor wafer by a series of process steps including doping, deposition, photolithography, etching, and planarization. Doping introduces impurities into the semiconductor material by techniques such as ion implantation or thermal diffusion. The doping process modifies the electrical conductivity of semiconductor material in active devices, transforming the semiconductor material into an insulator, conductor, or dynamically changing the semiconductor material conductivity in response to an electric field or base current. Transistors contain regions of varying types and degrees of doping arranged as necessary to enable the transistor to promote or restrict the flow of electrical current upon the application of the electric field or base current.

Active and passive components are formed by layers of materials with different electrical properties. The layers can be formed by a variety of deposition techniques determined in part by the type of material being deposited. For example, thin film deposition can involve chemical vapor deposition (CVD), physical vapor deposition (PVD), electrolytic plating, and electroless plating processes. Each layer is generally patterned to form portions of active components, passive components, or electrical connections between components.

The layers can be patterned using photolithography, which involves the deposition of light sensitive material, e.g., photoresist, over the layer to be patterned. A pattern is transferred from a photomask to the photoresist using light. The portion of the photoresist pattern subjected to light is removed using a solvent, exposing portions of the underlying layer to be patterned. The remainder of the photoresist is removed, leaving behind a patterned layer. Alternatively, some types of materials are patterned by directly depositing the material into the areas or voids formed by a previous deposition/etch process using techniques such as electroless and electrolytic plating.

Depositing a thin film of material over an existing pattern can exaggerate the underlying pattern and create a non-uniformly flat surface. A uniformly flat surface is required to produce smaller and more densely packed active and passive components. Planarization can be used to remove material from the surface of the wafer and produce a uniformly flat surface. Planarization involves polishing the surface of the wafer with a polishing pad. An abrasive material and corrosive chemical are added to the surface of the wafer during polishing. The combined mechanical action of the abrasive and corrosive action of the chemical removes any irregular topography, resulting in a uniformly flat surface.

Back-end manufacturing refers to cutting or singulating the finished wafer into the individual die and then packaging the die for structural support and environmental isolation. To singulate the die, the wafer is scored and broken along non-functional regions of the wafer called saw streets or scribes. The wafer is singulated using a laser cutting tool or saw blade. After singulation, the individual die are mounted to a package substrate that includes pins or contact pads for interconnection with other system components. Contact pads formed over the semiconductor die are then connected to contact pads within the package. The electrical connections can be made with solder bumps, stud bumps, conductive paste, or wirebonds. An encapsulant or other molding material is deposited over the package to provide physical support and electrical isolation. The finished package is then inserted into an electrical system and the functionality of the semiconductor device is made available to the other system components.

Figure 6:
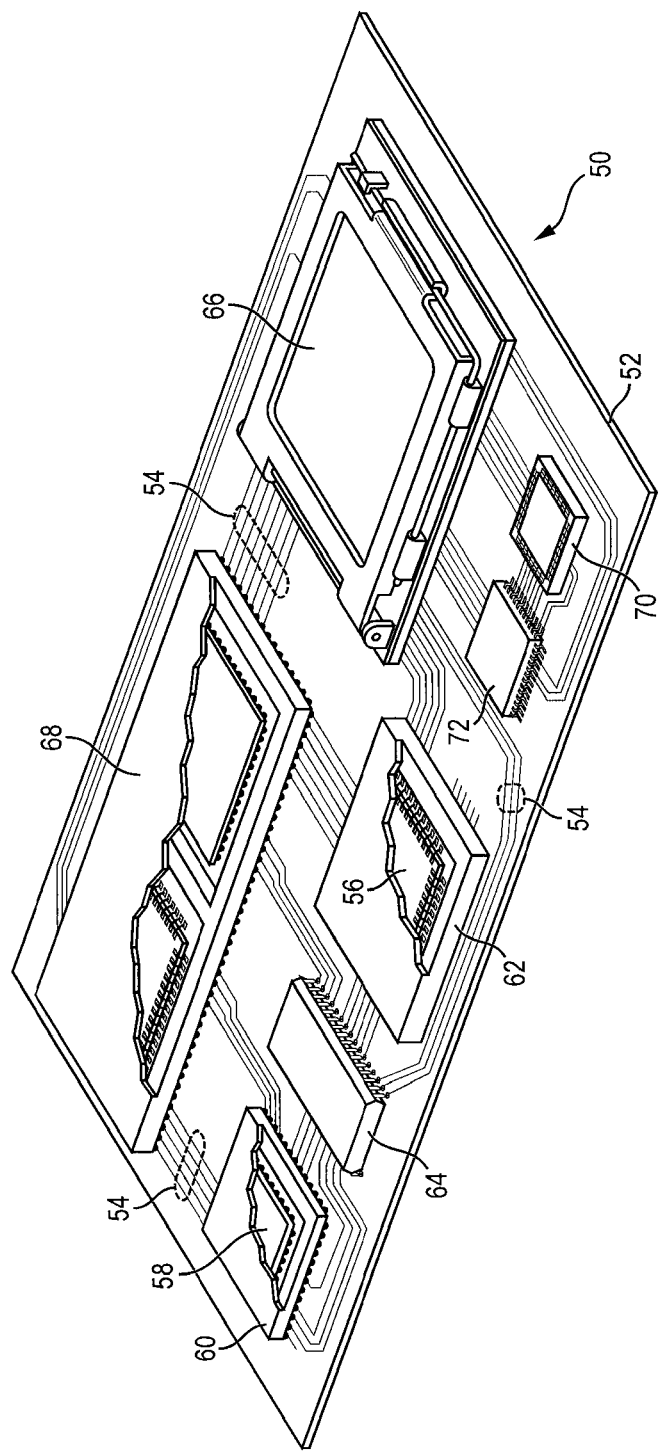
FIG. 6 illustrates a PCB with different types of packages mounted to its surface.

FIG. 6 illustrates electronic device 50 having a chip carrier substrate or printed circuit board (PCB) 52 with a plurality of semiconductor packages mounted on its surface. Electronic device 50 can have one type of semiconductor package, or multiple types of semiconductor packages, depending on the application. The different types of semiconductor packages are shown in FIG. 6 for purposes of illustration.

Electronic device 50 can be a stand-alone system that uses the semiconductor packages to perform one or more electrical functions. Alternatively, electronic device 50 can be a subcomponent of a larger system. For example, electronic device 50 can be part of a cellular phone, personal digital assistant (PDA), digital video camera (DVC), or other electronic communication device. Alternatively, electronic device 50 can be a graphics card, network interface card, or other signal processing card that can be inserted into a computer. The semiconductor package can include microprocessors, memories, application specific integrated circuits (ASIC), logic circuits, analog circuits, RF circuits, discrete devices, or other semiconductor die or electrical components. The miniaturization and the weight reduction are essential for these products to be accepted by the market. The distance between semiconductor devices must be decreased to achieve higher density.

In FIG. 6, PCB 52 provides a general substrate for structural support and electrical interconnect of the semiconductor packages mounted on the PCB. Conductive signal traces 54 are formed over a surface or within layers of PCB 52 using evaporation, electrolytic plating, electroless plating, screen printing, or other suitable metal deposition process. Signal traces 54 provide for electrical communication between each of the semiconductor packages, mounted components, and other external system components. Traces 54 also provide power and ground connections to each of the semiconductor packages.

In some embodiments, a semiconductor device has two packaging levels. First level packaging is a technique for mechanically and electrically attaching the semiconductor die to an intermediate carrier. Second level packaging involves mechanically and electrically attaching the intermediate carrier to the PCB. In other embodiments, a semiconductor device may only have the first level packaging where the die is mechanically and electrically mounted directly to the PCB.

For the purpose of illustration, several types of first level packaging, including wire bond package 56 and flipchip 58, are shown on PCB 52. Additionally, several types of second level packaging, including ball grid array (BGA) 60, bump chip carrier (BCC) 62, dual in-line package (DIP) 64, land grid array (LGA) 66, multi-chip module (MCM) 68, quad flat non-leaded package (QFN) 70, and quad flat package 72, are shown mounted on PCB 52. Depending upon the system requirements, any combination of semiconductor packages, configured with any combination of first and second level packaging styles, as well as other electronic components, can be connected to PCB 52. In some embodiments, electronic device 50 includes a single attached semiconductor package, while other embodiments call for multiple interconnected packages. By combining one or more semiconductor packages over a single substrate, manufacturers can incorporate pre-made components into electronic devices and systems. Because the semiconductor packages include sophisticated functionality, electronic devices can be manufactured using cheaper components and a streamlined manufacturing process. The resulting devices are less likely to fail and less expensive to manufacture resulting in a lower cost for consumers.

Figure 7A:
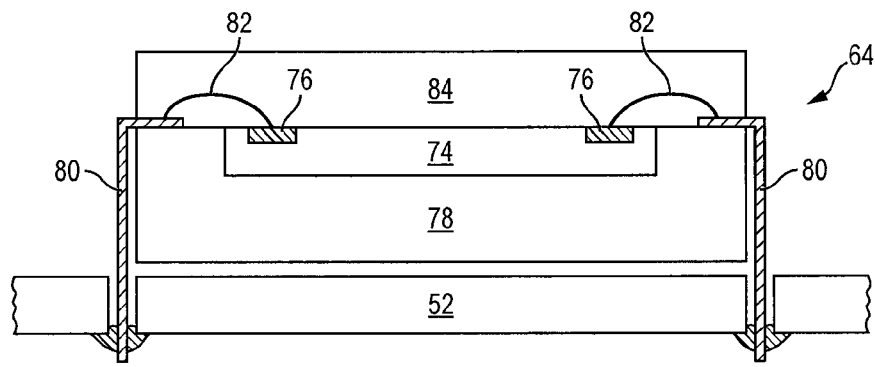
FIGS. 7a-7c illustrate further detail of the representative semiconductor packages mounted to the PCB.
Figure 7B:
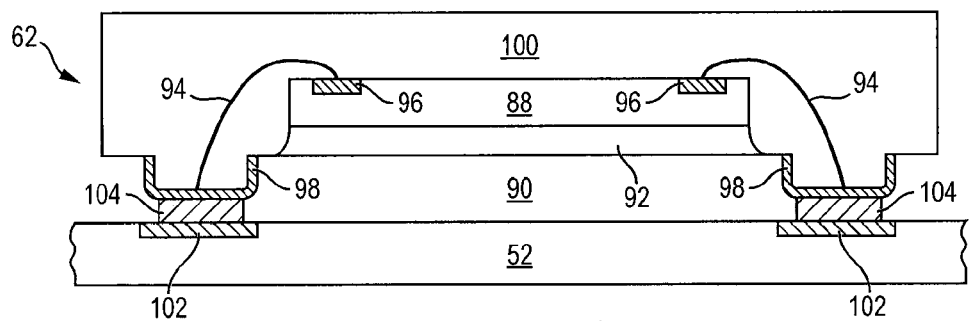
Figure 7C:
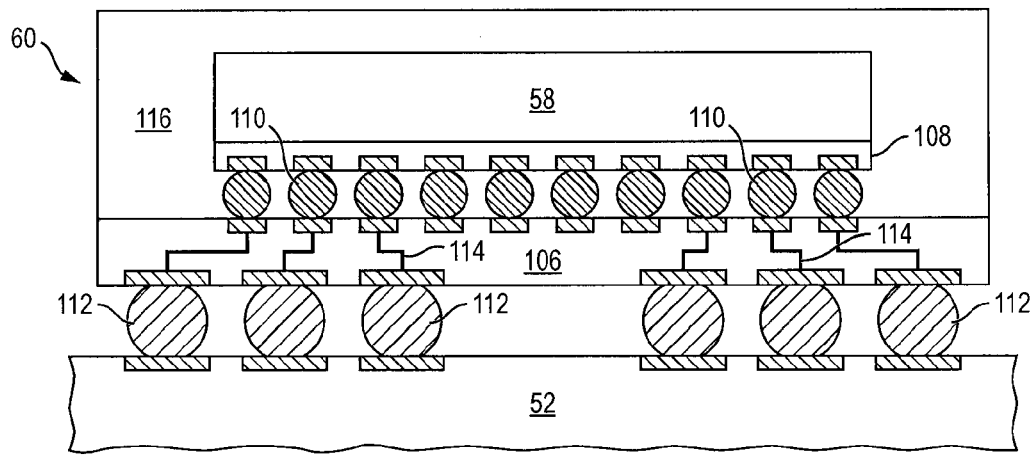

FIGS. 7a-7c show exemplary semiconductor packages. FIG. 7a illustrates further detail of DIP 64 mounted on PCB 52. Semiconductor die 74 includes an active region containing analog or digital circuits implemented as active devices, passive devices, conductive layers, and dielectric layers formed within the die and are electrically interconnected according to the electrical design of the die. For example, the circuit can include one or more transistors, diodes, inductors, capacitors, resistors, and other circuit elements formed within the active region of semiconductor die 74. Contact pads 76 are one or more layers of conductive material, such as aluminum (Al), copper (Cu), tin (Sn), nickel (Ni), gold (Au), or silver (Ag), and are electrically connected to the circuit elements formed within semiconductor die 74. During assembly of DIP 64, semiconductor die 74 is mounted to an intermediate carrier 78 using a gold-silicon eutectic layer or adhesive material such as thermal epoxy or epoxy resin. The package body includes an insulative packaging material such as polymer or ceramic. Conductor leads 80 and wire bonds 82 provide electrical interconnect between semiconductor die 74 and PCB 52. Encapsulant 84 is deposited over the package for environmental protection by preventing moisture and particles from entering the package and contaminating die 74 or wire bonds 82.

FIG. 7b illustrates further detail of BCC 62 mounted on PCB 52. Semiconductor die 88 is mounted over carrier 90 using an underfill or epoxy-resin adhesive material 92. Wire bonds 94 provide first level packaging interconnect between contact pads 96 and 98. Molding compound or encapsulant 100 is deposited over semiconductor die 88 and wire bonds 94 to provide physical support and electrical isolation for the device. Contact pads 102 are formed over a surface of PCB 52 using a suitable metal deposition process such as electrolytic plating or electroless plating to prevent oxidation. Contact pads 102 are electrically connected to one or more conductive signal traces 54 in PCB 52. Bumps 104 are formed between contact pads 98 of BCC 62 and contact pads 102 of PCB 52.

In FIG. 7c, semiconductor die 58 is mounted face down to intermediate carrier 106 with a flipchip style first level packaging. Active region 108 of semiconductor die 58 contains analog or digital circuits implemented as active devices, passive devices, conductive layers, and dielectric layers formed according to the electrical design of the die. For example, the circuit can include one or more transistors, diodes, inductors, capacitors, resistors, and other circuit elements within active region 108. Semiconductor die 58 is electrically and mechanically connected to carrier 106 through bumps 110.

BGA 60 is electrically and mechanically connected to PCB 52 with a BGA style second level packaging using bumps 112. Semiconductor die 58 is electrically connected to conductive signal traces 54 in PCB 52 through bumps 110, signal lines 114, and bumps 112. A molding compound or encapsulant 116 is deposited over semiconductor die 58 and carrier 106 to provide physical support and electrical isolation for the device. The flipchip semiconductor device provides a short electrical conduction path from the active devices on semiconductor die 58 to conduction tracks on PCB 52 in order to reduce signal propagation distance, lower capacitance, and improve overall circuit performance. In another embodiment, the semiconductor die 58 can be mechanically and electrically connected directly to PCB 52 using flipchip style first level packaging without intermediate carrier 106.

In a flipchip type semiconductor die, the interconnect is accomplished by connecting the interconnect bump directly onto a narrow interconnection pad or narrow pad, rather than onto a conventional capture pad. The flipchip package substrate has a patterned metal layer on a die attach side of a dielectric substrate layer, a metal layer including interconnect sites, and a substrate including a masking layer having an opening spanning a plurality of the interconnect sites and traces. The opening has a generally elongated shape oriented so that its longer dimension spans multiple interconnect sites, traces, and other circuit elements. The shorter dimension of the elongated openings limit the exposure of the lengths of the interconnect sites. Accordingly, the flow of fusible material that is melted during the reflow step in the interconnection process is limited along the length of the interconnect sites by the width of the mask opening. The number of interconnect sites on which the flow of melted bump material is so limited is determined by the length of the mask opening and the number of interconnect sites spanned by the opening. The masking layer allows confinement of the bump material during the remelt stage of interconnection, yet it is within common design rules for mask patterning.

Figure 8:
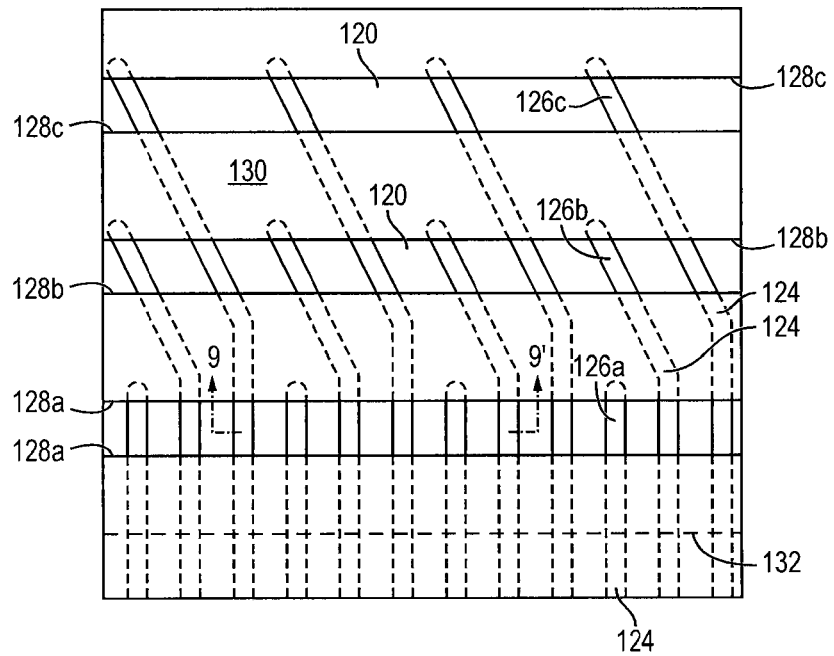
FIG. 8 illustrates a flipchip package substrate with a solder mask having elongated openings parallel to a plane of the package substrate surface.
Figure 9:
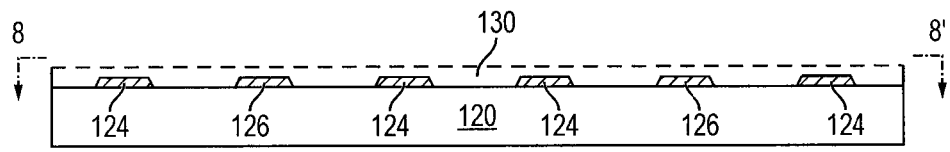
FIG. 9 illustrates the flipchip interconnection of FIG. 8 employing the solder mask with elongated openings perpendicular to the plane of the package substrate surface.

FIG. 8 shows substrate 120, in a diagrammatic sectional view or plan view taken in a plane parallel to the substrate surface. Certain features are shown as if transparent. Substrate 120 has a dielectric layer supporting a metal layer at the die attach surface, patterned to form circuitry underlying the masking layer. The circuitry includes traces or leads 124 exposed at interconnect sites 126a, 126b, and 126c by elongated openings 128a, 128b, and 128c in masking layer 130, as shown in FIG. 9. The interconnect sites 126a-126c are arranged in an orthogonal array of three rows each generally parallel to the die edge, as indicated by broken line 132.

The elongated openings 128a-128c in masking layer 130 expose multiple interconnect sites 126a-126c associated with two or more adjacent circuit features. As shown in FIG. 8, each of the elongated openings 128a-128c exposes one of the rows of interconnect sites 126a-126c, which can be a row on an array of interconnect sites. The row of interconnect sites 126a-126c exposed need not be in a straight line, that is openings 128a-128c need not be rectangular. The openings 128a-128c can have a regular or irregular shape. Where the elongated openings 128a-128c have a shape of a regular polygon, such as a rectangle, the elongated opening need not necessarily be oriented parallel to a row of interconnect sites or to the die margin. In addition, some of leads 124 pass beneath multiple elongated openings 128a-128c.

Figure 10:
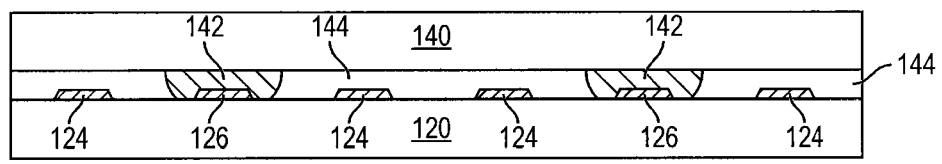
FIG. 10 illustrates a flipchip assembly with a semiconductor die interconnected on a substrate as in FIGS. 8 and 9.

In FIG. 10, a flipchip interconnect structure is formed by providing semiconductor die 140 with bumps 142 attached to die pads, and bonding bumps 142 onto interconnect sites 126 on substrate 120 in a high trace density arrangement. Other leads 124 are interconnected at other localities, which would be visible in other sectional views. The narrow dimension width of the elongated masking openings 128a-128c serves to limit flow of bump material away from interconnect sites 126a-126c along the wettable lead 124. The width of the elongated mask openings 128a-128c can be determined by the design rules for patterning the masking layer. In one embodiment, the nominal mask opening width can be in the range about 80 to 90 µm or less. Alternatively, the nominal mask opening width can be 100 µm or more. Mask materials can be resolved at such pitches and, particularly, substrates can be made comparatively inexpensively with masking layers having 90 µm openings and having alignment tolerances plus or minus 25 µm. In some embodiments, laminate substrates made according to standard design rules, such as 4-metal layer laminates, are used.

The feature sizes required for masking layer 130 can be made coarser because the elongated mask openings 128a-128c span a number of interconnect sites 126a-126c. The alignment of mask openings 128a-128c with interconnect sites 126a-126c can be significantly relaxed. The risk of partial exposure of bondable areas of leads 124 at interconnect sites 126a-126c is practically avoided. Bump material run-off along the length of the circuit features at interconnect sites 126a-126c is confined by the width of mask openings 128a-128c. Any runoff toward adjacent circuit features is reduced because the dielectric material of substrate 120 is not wettable by the bump material.

The electrical interconnect can be formed by thermo-mechanically joining bump 142 to interconnect sites 126a-126c without melting the bump material. A no-flow underfill material is cured to a gel stage. Bumps 142 are then melted in a reflow operation to form a reliable interconnection which confines the joint to a relatively small volume and minimizes the risk of bridging to an adjacent circuit element. In some embodiments, fillets are formed along the surrounding surface and exposed sidewalls of interconnect sites 126a-126c.

Solder paste can be provided at interconnect sites 126a-126c on leads 124, to provide a fusible medium for the interconnect. The paste is dispensed by a printing process, reflowed, and coined if necessary to provide uniform surfaces to meet bumps 142. The solder paste can be applied in the course of assembly, or a substrate can be provided with paste suitably patterned prior to assembly. Other approaches to applying solder selectively to interconnect sites 126a-126c include solder-on-lead embodiments, such as electroless plating and electroplating techniques. The solder-on-lead configuration provides additional solder volume for the interconnect, and can provide higher product yield and higher die standoff.

For interconnection of a semiconductor die having high-melting temperature bumps onto an organic substrate, such as a high-lead solder used with ceramic substrates, the masking layer limits the flow of fusible solder paste along the circuit element near the interconnect site. The solder paste can be selected to have a melting temperature low enough that the organic substrate is not damaged during reflow. To form the interconnect in such embodiments, the high-melting interconnect bumps are contacted with the solder-on-lead sites, and the remelt fuses the solder-on-lead to the bumps. Where a non-collapsible bump is used, together with a solder-on-lead process, no preapplied adhesive is required, as the displacement or flow of the solder is limited by the fact that only a small quantity of solder is present at each interconnect. The non-collapsible bump prevents collapse of the assembly. In other embodiments, the solder-on-lead configuration can use eutectic solder bumps.

For packages employing no-flow underfill techniques, a substrate is provided with at least one dielectric layer and having a metal layer on a die attach surface. The metal layer is patterned to provide circuitry, particularly traces or leads with interconnect sites on the die attach surface. The substrate is supported, for example on a carrier or stage, with a substrate surface opposite the die attach surface facing the support. A semiconductor die is provided with bumps attached to die pads on the active side. The bumps include a fusible material which contacts the mating surfaces of the leads. A quantity of an underfill material, such as an encapsulating resin adhesive, is dispensed over the die attach surface of the substrate, covering the interconnect sites on the leads over the active side of the semiconductor die. A pick-and-place tool with a chuck picks up the semiconductor die by contacting of the chuck with the backside of the die. Using the pick-and-place tool, the semiconductor die is positioned facing the substrate with the active side of the die toward the die attach surface of the substrate. The semiconductor die and substrate are aligned and moved one toward the other so that the bumps contact the corresponding interconnect sites on the traces or leads on the substrate. A force is applied to press the bumps onto the mating surfaces at the interconnect sites on the leads. The force is sufficient to displace the adhesive from between the bumps and the mating surfaces at the interconnect sites on the leads. The bumps are deformed by the force, breaking the oxide film on the contacting surface of the bumps and/or on the interconnect sites of leads. The deformation of the bumps may result in the fusible material of the bumps being pressed onto the top and over the edges of the interconnect sites. The adhesive is caused to cure at least partially by heating to a selected temperature. At this stage, the adhesive need only be partially cured to an extent sufficient subsequently to prevent flow of molten bump material along an interface between the adhesive and the conductive traces. The fusible material of the bumps is melted and then is re-solidified, forming a metallurgical interconnection between the bump and interconnect site. The adhesive is completely cured to finish the die mount and secure the electrical interconnection at the mating surface.

Where interconnect is formed by a no-flow underfill process, the no-flow underfill adhesive can be pre-applied to the die surface, or at least to the bumps on the die surface, rather than to the substrate. The adhesive can be pooled in a reservoir, and the active side of the semiconductor die can be dipped in the pool and removed so that a quantity of the adhesive is carried on the bumps. Using a pick-and-place tool, the semiconductor die is positioned facing a supported substrate with the active side of the die toward the die attach surface of the substrate. The semiconductor die and substrate are aligned and moved one toward the other so that the bumps contact the corresponding interconnect sites on the substrate. Such a method is described in U.S. Pat. No. 6,780,682, which is incorporated by reference. Then forcing, curing, and melting are carried out as described above.

In some approaches to flipchip interconnection, the metallurgical interconnection is formed first, and then an underfill material is flowed into the space between the semiconductor die and substrate. The no-flow underfill material is applied before the semiconductor die and substrate are brought together. The no-flow underfill material is displaced by the approach of the bumps onto the interconnect sites, and by the opposed surfaces of the die and the substrate. The no-flow underfill material can be non-conductive pastes or fast-gelling adhesive that gels sufficiently at the gel temperature in a time period in the order of 1-2 seconds.

The curing of the adhesive can be completed prior to, or concurrently with, or following melting the bump material. Typically, the adhesive is a thermally curable adhesive, and the extent of curing at any phase in the process is controlled by regulating the temperature. The components can be heated and cured by raising the temperature of the chuck on the pick and place tool, or by raising the temperature of the substrate support.

Alternative bump structures, such as composite bumps, can be employed in the BOL interconnects. Composite bumps have at least two bump portions, made of different bump materials, including one which is collapsible under reflow conditions, and one which is substantially non-collapsible under reflow conditions. The non-collapsible portion is attached to the interconnect site on the die. Typical materials for the non-collapsible portion include various solders having a high Pd content. Typical materials for the collapsible portion of the composite bump include eutectic solders. The collapsible portion is joined to the non-collapsible portion, and it is the collapsible portion that makes the connection with the interconnect site.

FIGS. 11-14 describe other embodiments with various interconnect structures applicable to the interconnect structure, as described in FIGS. 8-10. FIG. 11a shows a semiconductor wafer 220 with a base substrate material 222, such as silicon, germanium, gallium arsenide, indium phosphide, or silicon carbide, for structural support. A plurality of semiconductor die or components 224 is formed on wafer 220 separated by saw streets 226 as described above.

Figure 11A:
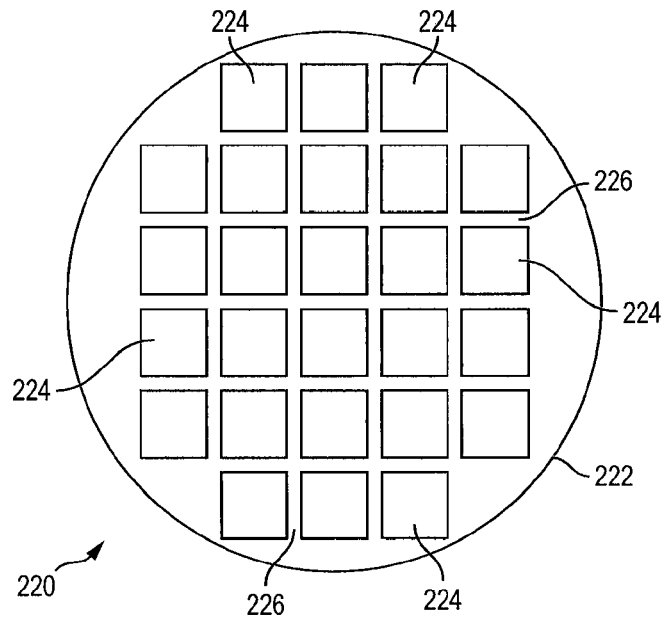
FIGS. 11a-11h illustrate various interconnect structures formed over a semiconductor die for bonding to conductive traces on a substrate.
Figure 11B:
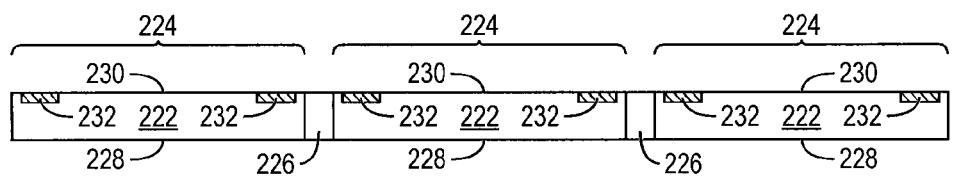

FIG. 11b shows a cross-sectional view of a portion of semiconductor wafer 220. Each semiconductor die 224 has a back surface 228 and active surface 230 containing analog or digital circuits implemented as active devices, passive devices, conductive layers, and dielectric layers formed within the die and electrically interconnected according to the electrical design and function of the die. For example, the circuit can include one or more transistors, diodes, and other circuit elements formed within active surface 230 to implement analog circuits or digital circuits, such as digital signal processor (DSP), ASIC, memory, or other signal processing circuit. Semiconductor die 224 can also contain integrated passive devices (IPDs), such as inductors, capacitors, and resistors, for RF signal processing. In one embodiment, semiconductor die 224 is a flipchip type semiconductor die.

An electrically conductive layer 232 is formed over active surface 230 using PVD, CVD, electrolytic plating, electroless plating process, or other suitable metal deposition process. Conductive layer 232 can be one or more layers of Al, Cu, Sn, Ni, Au, Ag, or other suitable electrically conductive material. Conductive layer 232 operates as contact pads electrically connected to the circuits on active surface 230.

Figure 11C:
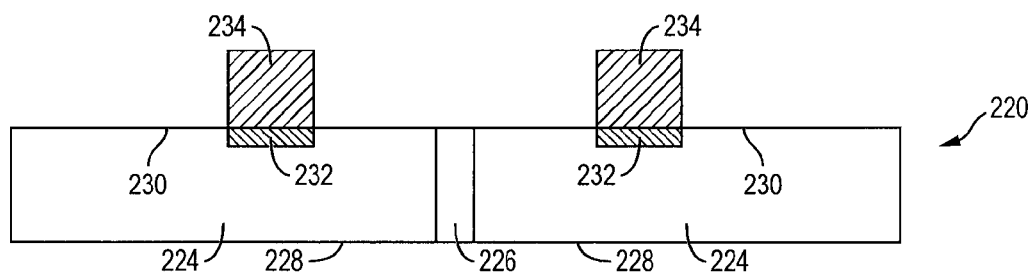
Figure 11D:
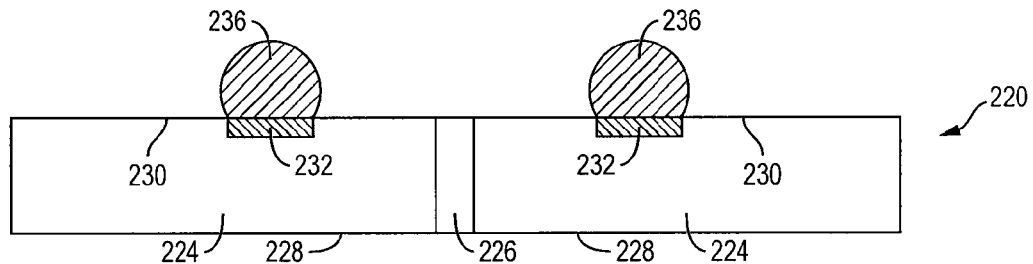

FIG. 11c shows a portion of semiconductor wafer 220 with an interconnect structure formed over contact pads 232. An electrically conductive bump material 234 is deposited over contact pads 232 using an evaporation, electrolytic plating, electroless plating, ball drop, or screen printing process. Bump material 234 can be Al, Sn, Ni, Au, Ag, Pb, Bi, Cu, solder, and combinations thereof, with an optional flux solution. For example, bump material 234 can be eutectic Sn/Pb, high-lead solder, or lead-free solder. Bump material 234 is generally compliant and undergoes plastic deformation greater than about 25 μm under a force equivalent to a vertical load of about 200 grams. Bump material 234 is bonded to contact pad 232 using a suitable attachment or bonding process. For example, bump material 234 can be compression bonded to contact pad 232. Bump material 234 can also be reflowed by heating the material above its melting point to form spherical balls or bumps 236, as shown in FIG. 11d. In some applications, bumps 236 are reflowed a second time to improve electrical connection to contact pad 232. Bumps 236 represent one type of interconnect structure that can be formed over contact pad 232. The interconnect structure can also use stud bump, micro bump, or other electrical interconnect.

Figure 11E:
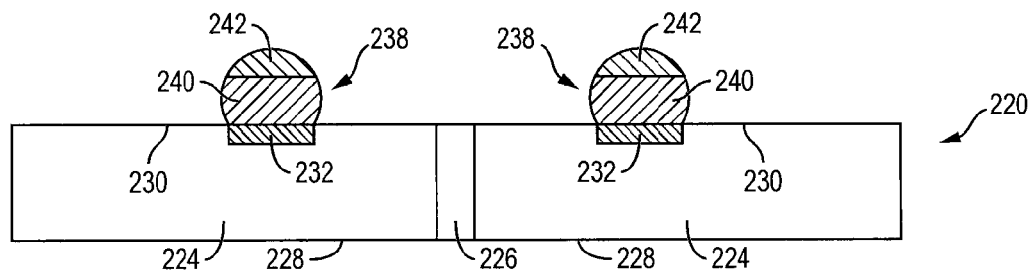

FIG. 11e shows another embodiment of the interconnect structure formed over contact pads 232 as composite bumps 238 including a non-fusible or non-collapsible portion 240 and fusible or collapsible portion 242. The fusible or collapsible and non-fusible or non-collapsible attributes are defined for bumps 238 with respect to reflow conditions. The non-fusible portion 240 can be Au, Cu, Ni, high-lead solder, or lead-tin alloy. The fusible portion 242 can be Sn, lead-free alloy, Sn—Ag alloy, Sn—Ag—Cu alloy, Sn—Ag-indium (In) alloy, eutectic solder, tin alloys with Ag, Cu, or Pb, or other relatively low temperature melt solder. In one embodiment, given a contact pad 232 width or diameter of 100 μm, the non-fusible portion 240 is about 45 μm in height and fusible portion 242 is about 35 μm in height.

Figure 11F:
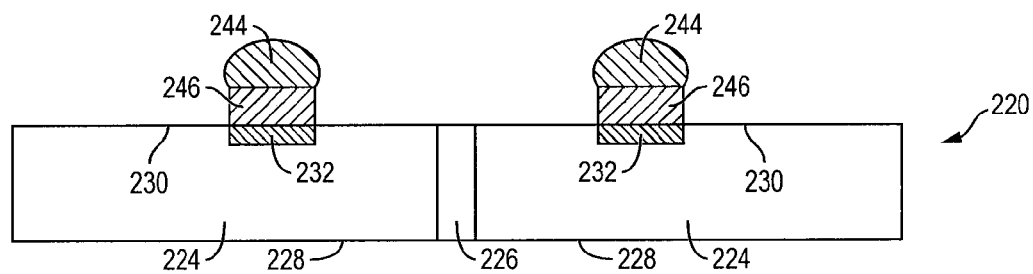

FIG. 11f shows another embodiment of the interconnect structure formed over contact pads 232 as bump 244 over conductive pillar 246. Bump 244 is fusible or collapsible and conductive pillar 246 is non-fusible or non-collapsible. The fusible or collapsible and non-fusible or non-collapsible attributes are defined with respect to reflow conditions. Bump 244 can be Sn, lead-free alloy, Sn—Ag alloy, Sn—Ag—Cu alloy, Sn—Ag—In alloy, eutectic solder, tin alloys with Ag, Cu, or Pb, or other relatively low temperature melt solder. Conductive pillar 246 can be Au, Cu, Ni, high-lead solder, or lead-tin alloy. In one embodiment, conductive pillar 246 is a Cu pillar and bump 244 is a solder cap. Given a contact pad 232 width or diameter of 100 μm, conductive pillar 246 is about 45 μm in height and bump 244 is about 35 μm in height.

Figure 11G:
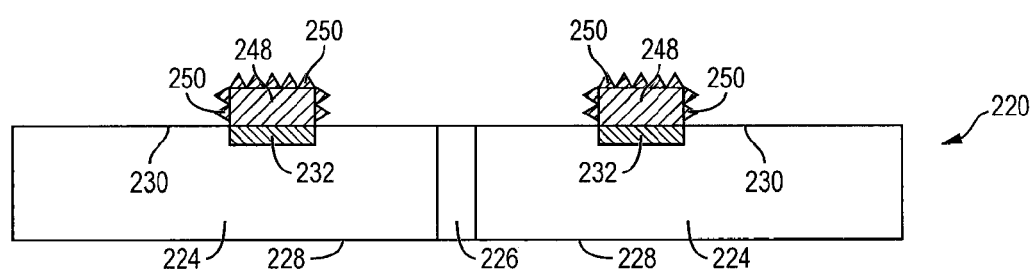

FIG. 11g shows another embodiment of the interconnect structure formed over contact pads 232 as bump material 248 with asperities 250. Bump material 248 is soft and deformable under reflow conditions with a low yield strength and high elongation to failure, similar to bump material 234. Asperities 250 are formed with a plated surface finish and are shown exaggerated in the figures for purposes of illustration. The scale of asperities 250 is generally in the order about 1-25 μm. The asperities can also be formed on bump 236, composite bump 238, and bump 244.

Figure 11H:
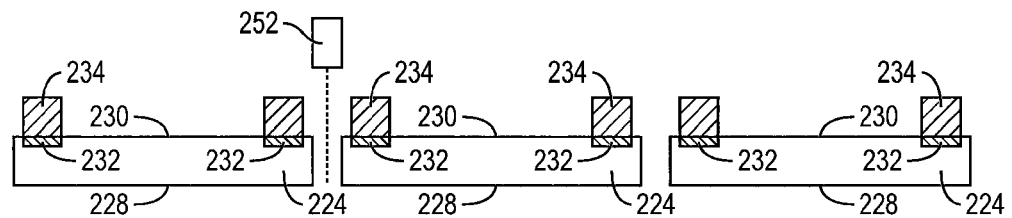

In FIG. 11h, semiconductor wafer 220 is singulated through saw street 226 using a saw blade or laser cutting tool 252 into individual semiconductor die 224.

Figure 12A:
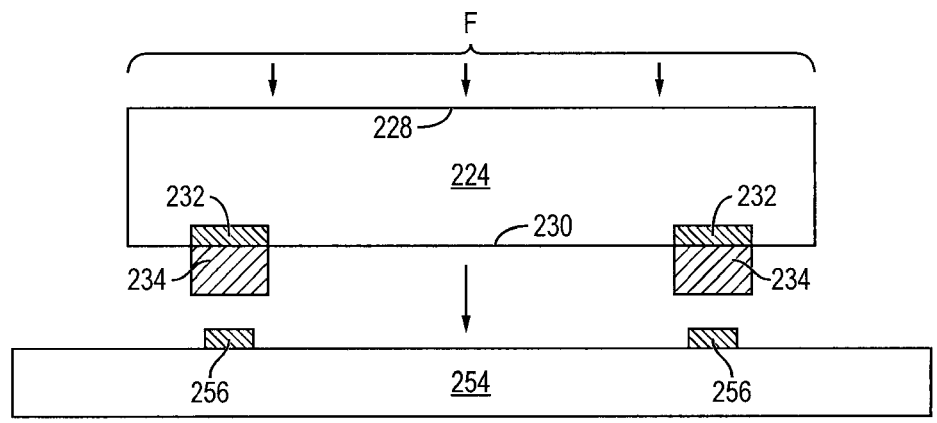
FIGS. 12a-12g illustrate the semiconductor die and interconnect structure bonded to the conductive traces.

FIG. 12a shows a substrate or PCB 254 with conductive trace 256. Substrate 254 can be a single-sided FR5 laminate or 2-sided BT-resin laminate. Semiconductor die 224 is positioned so that bump material 234 is aligned with an interconnect site on conductive trace 256, see FIGS. 20a-20g. Alternatively, bump material 234 can be aligned with a conductive pad or other interconnect site formed on substrate 254. Bump material 234 is wider than conductive trace 256. In one embodiment, bump material 234 has a width of less than 100 μm and conductive trace or pad 256 has a width of 35 μm for a bump pitch of 150 μm. Conductive traces 256 are applicable to the interconnect structure, as described in FIGS. 8-10.

Figure 12B:
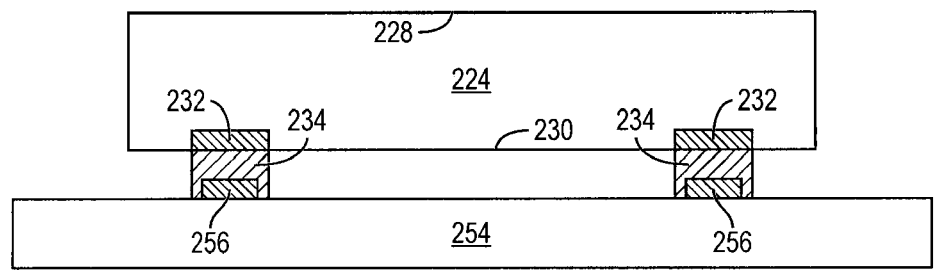

A pressure or force F is applied to back surface 228 of semiconductor die 224 to press bump material 234 onto conductive trace 256. The force F can be applied with an elevated temperature. Due to the compliant nature of bump material 234, the bump material deforms or extrudes around the top surface and side surface of conductive trace 256, referred to as BOL. In particular, the application of pressure causes bump material 234 to undergo a plastic deformation greater than about 25 μm under force F equivalent to a vertical load of about 200 grams and cover the top surface and side surface of the conductive trace, as shown in FIG. 12b. Bump material 234 can also be metallurgically connected to conductive trace 256 by bringing the bump material in physical contact with the conductive trace and then reflowing the bump material under a reflow temperature.

By making conductive trace 256 narrower than bump material 234, the conductive trace pitch can be reduced to increase routing density and I/O count. The narrower conductive trace 256 reduces the force F needed to deform bump material 234 around the conductive trace. For example, the requisite force F may be 30-50% of the force needed to deform bump material against a conductive trace or pad that is wider than the bump material. The lower compressive force F is useful for fine pitch interconnect and small die to maintain coplanarity with a specified tolerance and achieve uniform z-direction deformation and high reliability interconnect union. In addition, deforming bump material 234 around conductive trace 256 mechanically locks the bump to the trace to prevent die shifting or die floating during reflow.

Figure 12C:
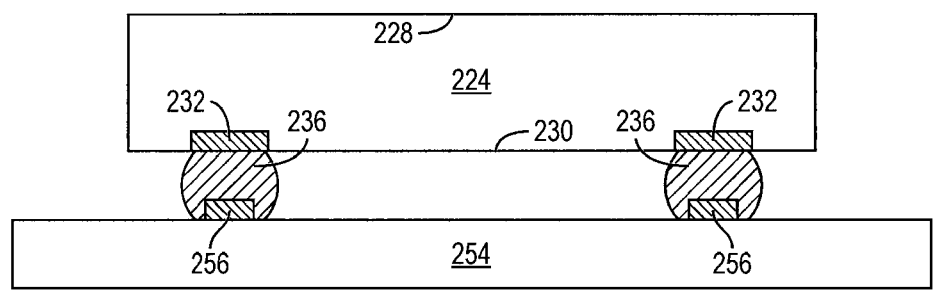

FIG. 12c shows bump 236 formed over contact pad 232 of semiconductor die 224. Semiconductor die 224 is positioned so that bump 236 is aligned with an interconnect site on conductive trace 256. Alternatively, bump 236 can be aligned with a conductive pad or other interconnect site formed on substrate 254. Bump 236 is wider than conductive trace 256. Conductive traces 256 are applicable to the interconnect structure, as described in FIGS. 8-10.

A pressure or force F is applied to back surface 228 of semiconductor die 224 to press bump 236 onto conductive trace 256. The force F can be applied with an elevated temperature. Due to the compliant nature of bump 236, the bump deforms or extrudes around the top surface and side surface of conductive trace 256. In particular, the application of pressure causes bump material 236 to undergo a plastic deformation and cover the top surface and side surface of conductive trace 256. Bump 236 can also be metallurgically connected to conductive trace 256 by bringing the bump in physical contact with the conductive trace under reflow temperature.

By making conductive trace 256 narrower than bump 236, the conductive trace pitch can be reduced to increase routing density and I/O count. The narrower conductive trace 256 reduces the force F needed to deform bump 236 around the conductive trace. For example, the requisite force F may be 30-50% of the force needed to deform a bump against a conductive trace or pad that is wider than the bump. The lower compressive force F is useful for fine pitch interconnect and small die to maintain coplanarity within a specified tolerance and achieve uniform z-direction deformation and high reliability interconnect union. In addition, deforming bump 236 around conductive trace 256 mechanically locks the bump to the trace to prevent die shifting or die floating during reflow.

Figure 12D:
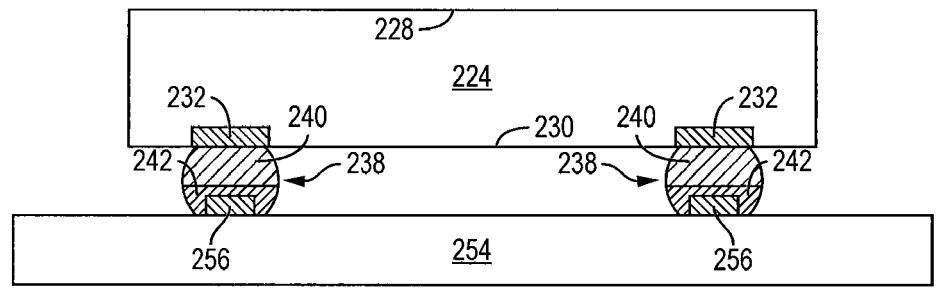

FIG. 12d shows composite bump 238 formed over contact pad 232 of semiconductor die 224. Semiconductor die 224 is positioned so that composite bump 238 is aligned with an interconnect site on conductive trace 256. Alternatively, composite bump 238 can be aligned with a conductive pad or other interconnect site formed on substrate 254. Composite bump 238 is wider than conductive trace 256. Conductive traces 256 are applicable to the interconnect structure, as described in FIGS. 8-10.

A pressure or force F is applied to back surface 228 of semiconductor die 224 to press fusible portion 242 onto conductive trace 256. The force F can be applied with an elevated temperature. Due to the compliant nature of fusible portion 242, the fusible portion deforms or extrudes around the top surface and side surface of conductive trace 256. In particular, the application of pressure causes fusible portion 242 to undergo a plastic deformation and cover the top surface and side surface of conductive trace 256. Composite bump 238 can also be metallurgically connected to conductive trace 256 by bringing fusible portion 242 in physical contact with the conductive trace under reflow temperature. The non-fusible portion 240 does not melt or deform during the application of pressure or temperature and retains its height and shape as a vertical standoff between semiconductor die 224 and substrate 254. The additional displacement between semiconductor die 224 and substrate 254 provides greater coplanarity tolerance between the mating surfaces.

During a reflow process, a large number (e.g., thousands) of composite bumps 238 on semiconductor die 224 are attached to interconnect sites on conductive trace 256 of substrate 254. Some of the bumps 238 may fail to properly connect to conductive trace 256, particularly if die 224 is warped. Recall that composite bump 238 is wider than conductive trace 256. With a proper force applied, the fusible portion 242 deforms or extrudes around the top surface and side surface of conductive trace 256 and mechanically locks composite bump 238 to the conductive trace. The mechanical interlock is formed by nature of the fusible portion 242 being softer and more compliant than conductive trace 256 and therefore deforming over the top surface and around the side surface of the conductive trace for greater contact surface area. The mechanical interlock between composite bump 238 and conductive trace 256 holds the bump to the conductive trace during reflow, i.e., the bump and conductive trace do not lose contact. Accordingly, composite bump 238 mating to conductive trace 256 reduces bump interconnect failures.

Figure 12E:
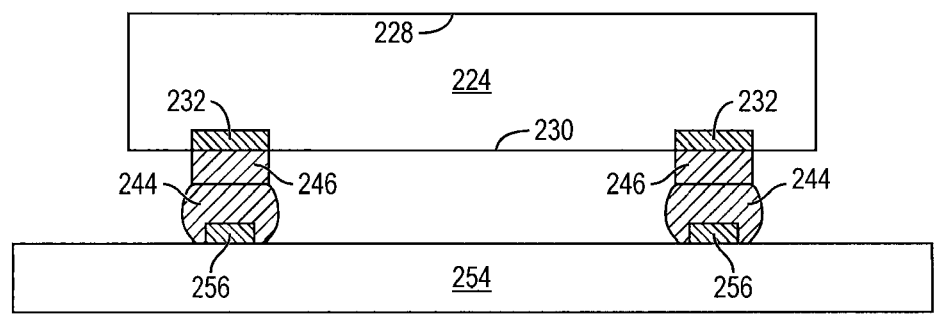

FIG. 12e shows conductive pillar 246 and bump 244 formed over contact pad 232 of semiconductor die 224. Semiconductor die 224 is positioned so that bump 244 is aligned with an interconnect site on conductive trace 256. Alternatively, bump 244 can be aligned with a conductive pad or other interconnect site formed on substrate 254. Bump 244 is wider than conductive trace 256. Conductive traces 256 are applicable to the interconnect structure, as described in FIGS. 8-10.

A pressure or force F is applied to back surface 228 of semiconductor die 224 to press bump 244 onto conductive trace 256. The force F can be applied with an elevated temperature. Due to the compliant nature of bump 244, the bump deforms or extrudes around the top surface and side surface of conductive trace 256. In particular, the application of pressure causes bump 244 to undergo a plastic deformation and cover the top surface and side surface of conductive trace 256. Conductive pillar 246 and bump 244 can also be metallurgically connected to conductive trace 256 by bringing the bump in physical contact with the conductive trace under reflow temperature. Conductive pillar 246 does not melt or deform during the application of pressure or temperature and retains its height and shape as a vertical standoff between semiconductor die 224 and substrate 254. The additional displacement between semiconductor die 224 and substrate 254 provides greater coplanarity tolerance between the mating surfaces. The wider bump 244 and narrower conductive trace 256 have similar low requisite compressive force and mechanical locking features and advantages described above for bump material 234 and bump 236.

Figure 12F:
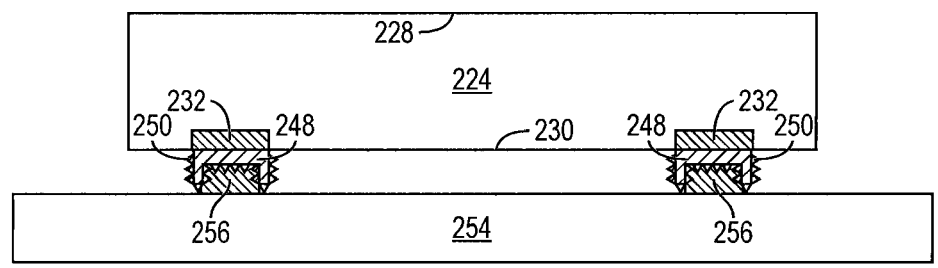

FIG. 12f shows bump material 248 with asperities 250 formed over contact pad 232 of semiconductor die 224. Semiconductor die 224 is positioned so that bump material 248 is aligned with an interconnect site on conductive trace 256. Alternatively, bump material 248 can be aligned with a conductive pad or other interconnect site formed on substrate 254. Bump material 248 is wider than conductive trace 256. A pressure or force F is applied to back surface 228 of semiconductor die 224 to press bump material 248 onto conductive trace 256. The force F can be applied with an elevated temperature. Due to the compliant nature of bump material 248, the bump deforms or extrudes around the top surface and side surface of conductive trace 256. In particular, the application of pressure causes bump material 248 to undergo a plastic deformation and cover the top surface and side surface of conductive trace 256. In addition, asperities 250 are metallurgically connected to conductive trace 256. Asperities 250 are sized on the order about 1-25 μm.

Figure 12G:
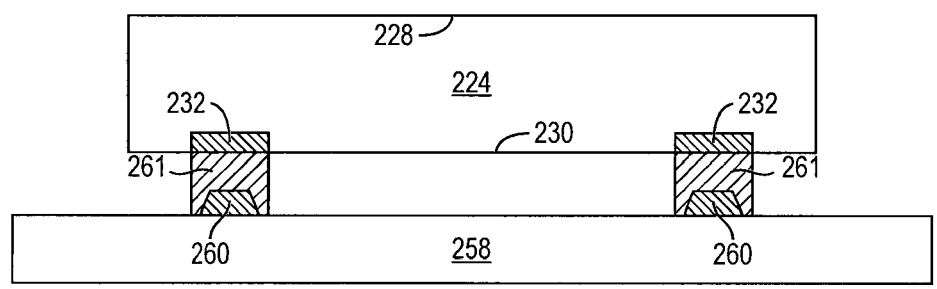

FIG. 12g shows a substrate or PCB 258 with trapezoidal conductive trace 260 having angled or sloped sides. Bump material 261 is formed over contact pad 232 of semiconductor die 224. Semiconductor die 224 is positioned so that bump material 261 is aligned with an interconnect site on conductive trace 260. Alternatively, bump material 261 can be aligned with a conductive pad or other interconnect site formed on substrate 258. Bump material 261 is wider than conductive trace 260. Conductive traces 260 are applicable to the interconnect structure, as described in FIGS. 8-10.

A pressure or force F is applied to back surface 228 of semiconductor die 224 to press bump material 261 onto conductive trace 260. The force F can be applied with an elevated temperature. Due to the compliant nature of bump material 261, the bump material deforms or extrudes around the top surface and side surface of conductive trace 260. In particular, the application of pressure causes bump material 261 to undergo a plastic deformation under force F to cover the top surface and the angled side surface of conductive trace 260. Bump material 261 can also be metallurgically connected to conductive trace 260 by bringing the bump material in physical contact with the conductive trace and then reflowing the bump material under a reflow temperature.

FIGS. 13a-13d show a BOL embodiment of semiconductor die 224 and elongated composite bump 262 having a non-fusible or non-collapsible portion 264 and fusible or collapsible portion 266. The non-fusible portion 264 can be Au, Cu, Ni, high-lead solder, or lead-tin alloy. The fusible portion 266 can be Sn, lead-free alloy, Sn—Ag alloy, Sn—Ag—Cu alloy, Sn—Ag—In alloy, eutectic solder, tin alloys with Ag, Cu, or Pb, or other relatively low temperature melt solder. The non-fusible portion 264 makes up a larger part of composite bump 262 than the fusible portion 266. The non-fusible portion 264 is fixed to contact pad 232 of semiconductor die 224.

Figure 13A:
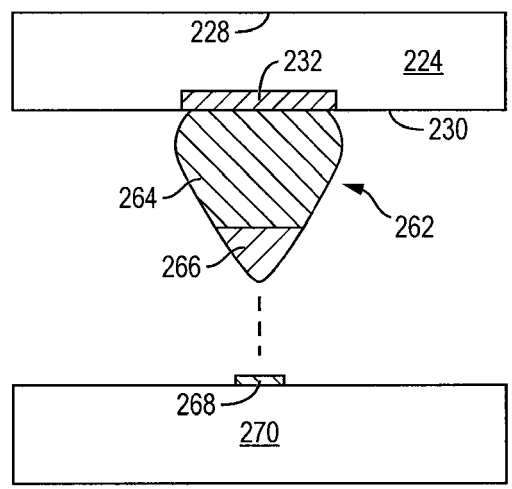
FIGS. 13a-13d illustrate the semiconductor die with a wedge-shaped interconnect structure bonded to the conductive traces.
Figure 13B:
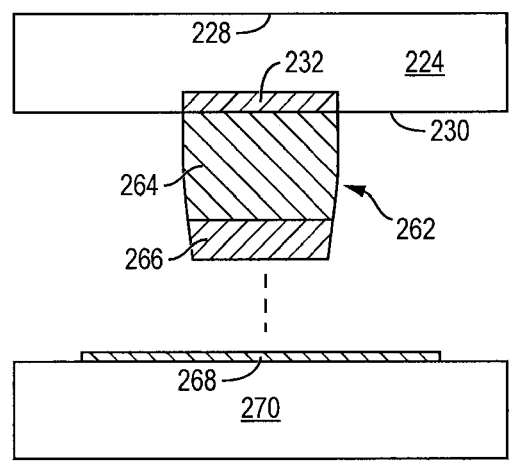
Figure 13C:
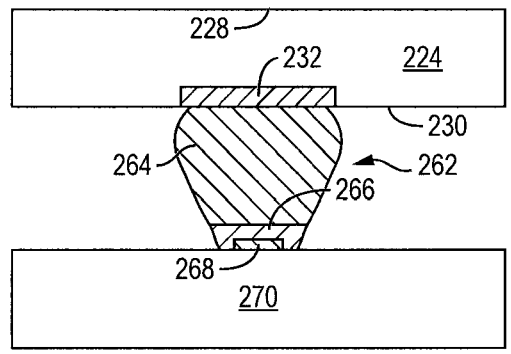
Figure 13D:
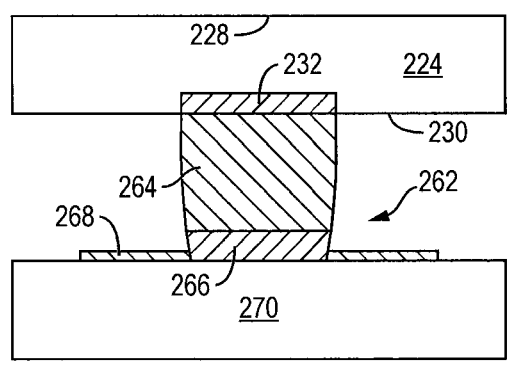

Semiconductor die 224 is positioned so that composite bump 262 is aligned with an interconnect site on conductive trace 268 formed on substrate 270, as shown in FIG. 13a. Composite bump 262 is tapered along conductive trace 268, i.e., the composite bump has a wedge shape, longer along a length of conductive trace 268 and narrower across the conductive trace. The tapered aspect of composite bump 262 occurs along the length of conductive trace 268. The view in FIG. 13a shows the shorter aspect or narrowing taper co-linear with conductive trace 268. The view in FIG. 13b, normal to FIG. 13a, shows the longer aspect of the wedge-shaped composite bump 262. The shorter aspect of composite bump 262 is wider than conductive trace 268. The fusible portion 266 collapses around conductive trace 268 upon application of pressure and/or reflow with heat, as shown in FIGS. 13c and 13d. The non-fusible portion 264 does not melt or deform during reflow and retains its form and shape. The non-fusible portion 264 can be dimensioned to provide a standoff distance between semiconductor die 224 and substrate 270. A finish such as Cu OSP can be applied to substrate 270. Conductive traces 268 are applicable to the interconnect structure, as described in FIGS. 8-10.

During a reflow process, a large number (e.g., thousands) of composite bumps 262 on semiconductor die 224 are attached to interconnect sites on conductive trace 268 of substrate 270. Some of the bumps 262 may fail to properly connect to conductive trace 268, particularly if semiconductor die 224 is warped. Recall that composite bump 262 is wider than conductive trace 268. With a proper force applied, the fusible portion 266 deforms or extrudes around the top surface and side surface of conductive trace 268 and mechanically locks composite bump 262 to the conductive trace. The mechanical interlock is formed by nature of the fusible portion 266 being softer and more compliant than conductive trace 268 and therefore deforming around the top surface and side surface of the conductive trace for greater contact area. The wedge-shape of composite bump 262 increases contact area between the bump and conductive trace, e.g., along the longer aspect of FIGS. 13b and 13d, without sacrificing pitch along the shorter aspect of FIGS. 13a and 13c. The mechanical interlock between composite bump 262 and conductive trace 268 holds the bump to the conductive trace during reflow, i.e., the bump and conductive trace do not lose contact. Accordingly, composite bump 262 mating to conductive trace 268 reduces bump interconnect failures.

Figure 14A:
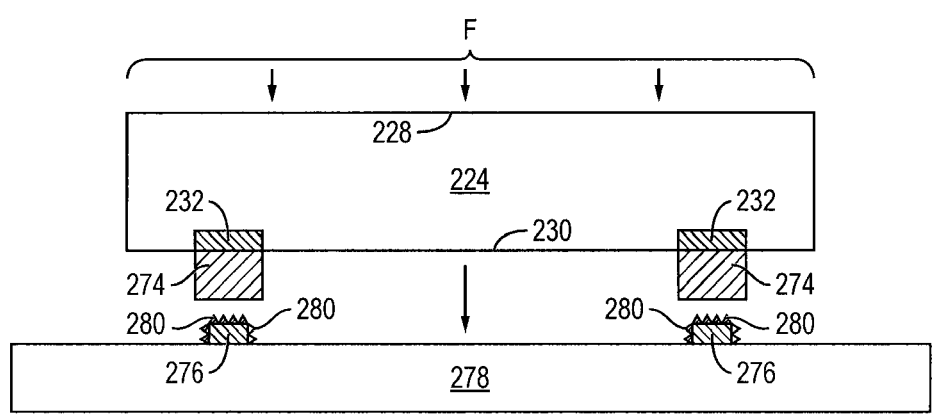
FIGS. 14a-14d illustrate another embodiment of the semiconductor die and interconnect structure bonded to the conductive traces.

FIGS. 14a-14d show a BOL embodiment of semiconductor die 224 with bump material 274 formed over contact pads 232, similar to FIG. 11c. In FIG. 14a, bump material 274 is generally compliant and undergoes plastic deformation greater than about 25 μm under a force equivalent to a vertical load of about 200 grams. Bump material 274 is wider than conductive trace 276 on substrate 278. A plurality of asperities 280 is formed on conductive trace 276 with a height on the order about 1-25 μm.

Figure 14B:
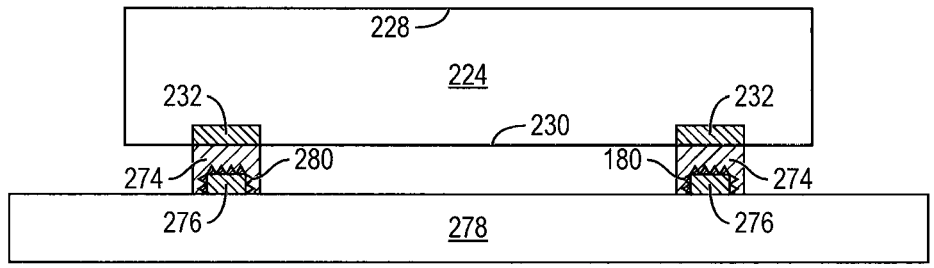

Semiconductor die 224 is positioned so that bump material 274 is aligned with an interconnect site on conductive trace 276. Alternatively, bump material 274 can be aligned with a conductive pad or other interconnect site formed on substrate 278. A pressure or force F is applied to back surface 228 of semiconductor die 224 to press bump material 274 onto conductive trace 276 and asperities 280, as shown in FIG. 14b. The force F can be applied with an elevated temperature. Due to the compliant nature of bump material 274, the bump material deforms or extrudes around the top surface and side surface of conductive trace 276 and asperities 280. In particular, the application of pressure causes bump material 274 to undergo a plastic deformation and cover the top surface and side surface of conductive trace 276 and asperities 280. The plastic flow of bump material 274 creates macroscopic mechanical interlocking points between the bump material and the top surface and side surface of conductive trace 276 and asperities 280. The plastic flow of bump material 274 occurs around the top surface and side surface of conductive trace 276 and asperities 280, but does not extend excessively onto substrate 278, which could cause electrical shorting and other defects. The mechanical interlock between the bump material and the top surface and side surface of conductive trace 276 and asperities 280 provides a robust connection with greater contact area between the respective surfaces, without significantly increasing the bonding force. The mechanical interlock between the bump material and the top surface and side surface of conductive trace 276 and asperities 280 also reduces lateral die shifting during subsequent manufacturing processes, such as encapsulation.

Figure 14C:
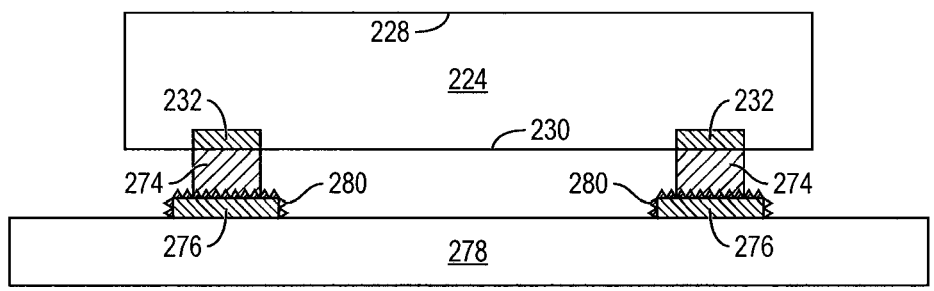

FIG. 14c shows another BOL embodiment with bump material 274 narrower than conductive trace 276. A pressure or force F is applied to back surface 228 of semiconductor die 224 to press bump material 274 onto conductive trace 276 and asperities 280. The force F can be applied with an elevated temperature. Due to the compliant nature of bump material 274, the bump material deforms or extrudes over the top surface of conductive trace 276 and asperities 280. In particular, the application of pressure causes bump material 274 to undergo a plastic deformation and cover the top surface of conductive trace 276 and asperities 280. The plastic flow of bump material 274 creates macroscopic mechanical interlocking points between the bump material and the top surface of conductive trace 276 and asperities 280. The mechanical interlock between the bump material and the top surface of conductive trace 276 and asperities 280 provides a robust connection with greater contact area between the respective surfaces, without significantly increasing the bonding force. The mechanical interlock between the bump material and the top surface of conductive trace 276 and asperities 280 also reduces lateral die shifting during subsequent manufacturing processes, such as encapsulation.

Figure 14D:
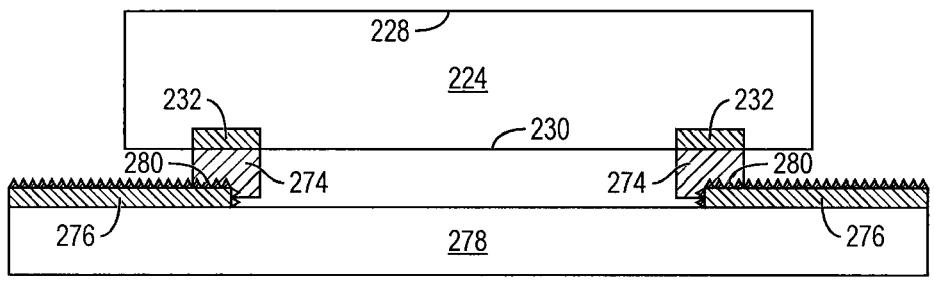

FIG. 14d shows another BOL embodiment with bump material 274 formed over an edge of conductive trace 276, i.e., part of the bump material is over the conductive trace and part of the bump material is not over the conductive trace. A pressure or force F is applied to back surface 228 of semiconductor die 224 to press bump material 274 onto conductive trace 276 and asperities 280. The force F can be applied with an elevated temperature. Due to the compliant nature of bump material 274, the bump material deforms or extrudes over the top surface and side surface of conductive trace 276 and asperities 280. In particular, the application of pressure causes bump material 274 to undergo a plastic deformation and cover the top surface and side surface of conductive trace 276 and asperities 280. The plastic flow of bump material 274 creates macroscopic mechanical interlocking between the bump material and the top surface and side surface of conductive trace 276 and asperities 280. The mechanical interlock between the bump material and the top surface and side surface of conductive trace 276 and asperities 280 provides a robust connection with greater contact area between the respective surfaces, without significantly increasing the bonding force. The mechanical interlock between the bump material and the top surface and side surface of conductive trace 276 and asperities 280 also reduces lateral die shifting during subsequent manufacturing processes, such as encapsulation.

Figure 15A:
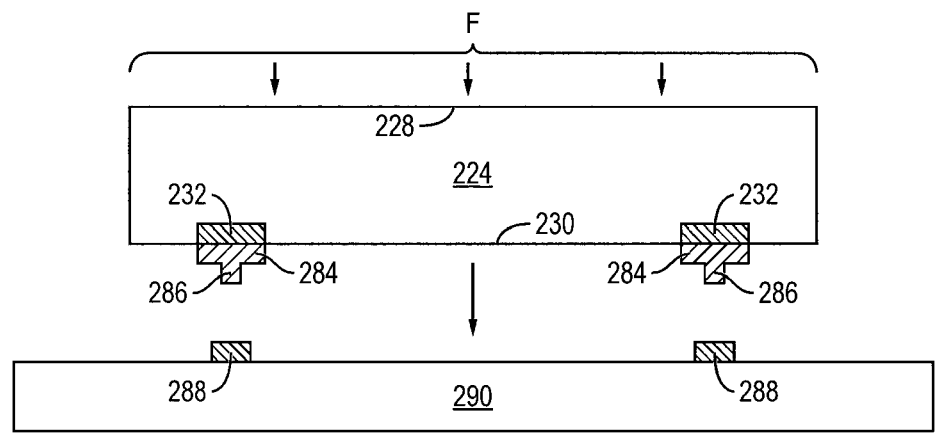
FIGS. 15a-15c illustrate stepped bump and stud bump interconnect structures bonded to the conductive traces.
Figure 15B:
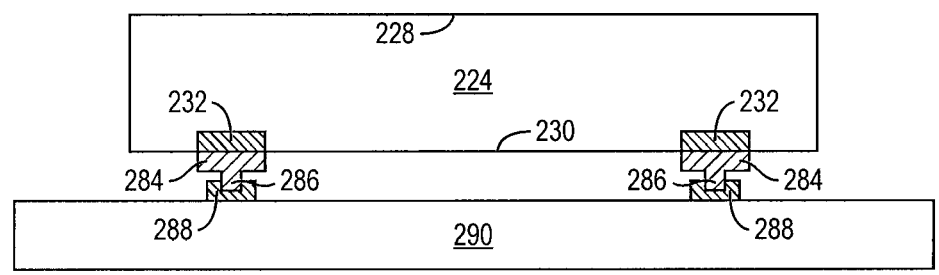
Figure 15C:
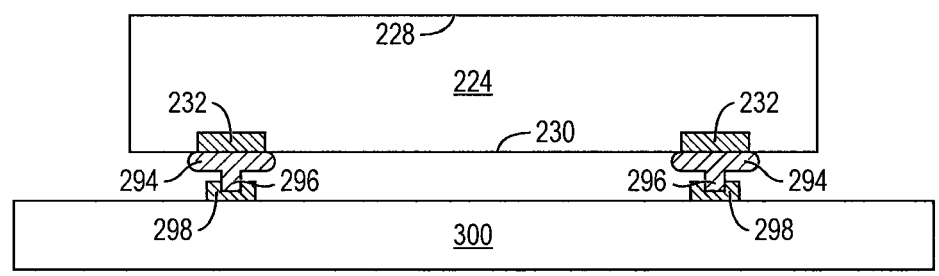

FIGS. 15a-15c show a BOL embodiment of semiconductor die 224 with bump material 284 formed over contact pads 232, similar to FIG. 11c. A tip 286 extends from the body of bump material 284 as a stepped bump with tip 286 narrower than the body of bump material 284, as shown in FIG. 15a. Semiconductor die 224 is positioned so that bump material 284 is aligned with an interconnect site on conductive trace 288 on substrate 290. More specifically, tip 286 is centered over an interconnect site on conductive trace 288. Alternatively, bump material 284 and tip 286 can be aligned with a conductive pad or other interconnect site formed on substrate 290. Bump material 284 is wider than conductive trace 288 on substrate 290.

Conductive trace 288 is generally compliant and undergoes plastic deformation greater than about 25 μm under a force equivalent to a vertical load of about 200 grams. A pressure or force F is applied to back surface 228 of semiconductor die 224 to press tip 284 onto conductive trace 288. The force F can be applied with an elevated temperature. Due to the compliant nature of conductive trace 288, the conductive trace deforms around tip 286, as shown in FIG. 15b. In particular, the application of pressure causes conductive trace 288 to undergo a plastic deformation and cover the top surface and side surface of tip 286.

FIG. 15c shows another BOL embodiment with rounded bump material 294 formed over contact pads 232. A tip 296 extends from the body of bump material 294 to form a stud bump with the tip narrower than the body of bump material 294. Semiconductor die 224 is positioned so that bump material 294 is aligned with an interconnect site on conductive trace 298 on substrate 300. More specifically, tip 296 is centered over an interconnect site on conductive trace 298. Alternatively, bump material 294 and tip 296 can be aligned with a conductive pad or other interconnect site formed on substrate 300. Bump material 294 is wider than conductive trace 298 on substrate 300.

Conductive trace 298 is generally compliant and undergoes plastic deformation greater than about 25 μm under a force equivalent to a vertical load of about 200 grams. A pressure or force F is applied to back surface 228 of semiconductor die 224 to press tip 296 onto conductive trace 298. The force F can be applied with an elevated temperature. Due to the compliant nature of conductive trace 298, the conductive trace deforms around tip 296. In particular, the application of pressure causes conductive trace 298 to undergo a plastic deformation and cover the top surface and side surface of tip 296.

The conductive traces described in FIGS. 12a-12g, 13a-13d, and 14a-14d can also be compliant material as described in FIGS. 15a-15c.

Figure 16A:
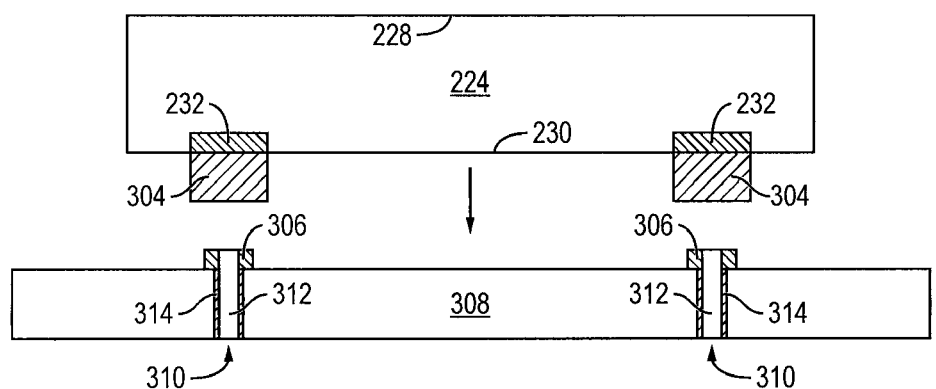
FIGS. 16a-16b illustrate conductive traces with conductive vias.
Figure 16B:
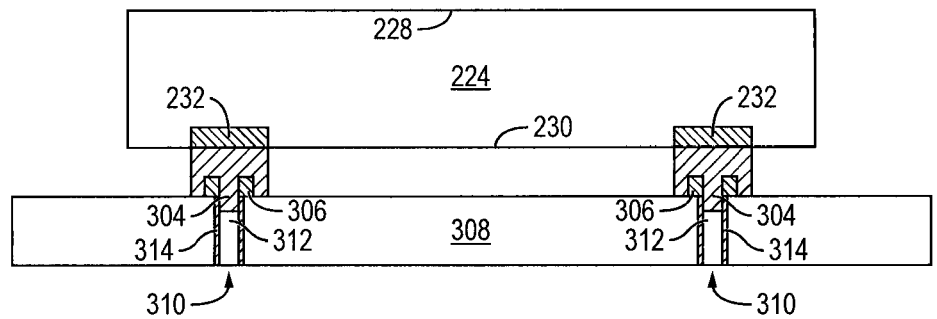

FIGS. 16a-16b show a BOL embodiment of semiconductor die 224 with bump material 304 formed over contact pads 232, similar to FIG. 11c. Bump material 304 is generally compliant and undergoes plastic deformation greater than about 25 μm under a force equivalent to a vertical load of about 200 grams. Bump material 304 is wider than conductive trace 306 on substrate 308. A conductive via 310 is formed through conductive trace 306 with an opening 312 and conductive sidewalls 314, as shown in FIG. 16a. Conductive traces 306 are applicable to the interconnect structure, as described in FIGS. 8-10.

Semiconductor die 224 is positioned so that bump material 304 is aligned with an interconnect site on conductive trace 306, see FIGS. 20a-20g. Alternatively, bump material 304 can be aligned with a conductive pad or other interconnect site formed on substrate 308. A pressure or force F is applied to back surface 228 of semiconductor die 224 to press bump material 304 onto conductive trace 306 and into opening 312 of conductive via 310. The force F can be applied with an elevated temperature. Due to the compliant nature of bump material 304, the bump material deforms or extrudes around the top surface and side surface of conductive trace 306 and into opening 312 of conductive vias 310, as shown in FIG. 16b. In particular, the application of pressure causes bump material 304 to undergo a plastic deformation and cover the top surface and side surface of conductive trace 306 and into opening 312 of conductive via 310. Bump material 304 is thus electrically connected to conductive trace 306 and conductive sidewalls 314 for z-direction vertical interconnect through substrate 308. The plastic flow of bump material 304 creates a mechanical interlock between the bump material and the top surface and side surface of conductive trace 306 and opening 312 of conductive via 310. The mechanical interlock between the bump material and the top surface and side surface of conductive trace 306 and opening 312 of conductive via 310 provides a robust connection with greater contact area between the respective surfaces, without significantly increasing the bonding force. The mechanical interlock between the bump material and the top surface and side surface of conductive trace 306 and opening 312 of conductive via 310 also reduces lateral die shifting during subsequent manufacturing processes, such as encapsulation. Since conductive via 310 is formed within the interconnect site with bump material 304, the total substrate interconnect area is reduced.

In the BOL embodiments of FIGS. 12a-12g, 13a-13d, 14a-14d, 15a-15c, and 16a-16b, by making the conductive trace narrower than the interconnect structure, the conductive trace pitch can be reduced to increase routing density and I/O count. The narrower conductive trace reduces the force F needed to deform the interconnect structure around the conductive trace. For example, the requisite force F may be 30-50% of the force needed to deform a bump against a conductive trace or pad that is wider than the bump. The lower compressive force F is useful for fine pitch interconnect and small die to maintain coplanarity within a specified tolerance and achieve uniform z-direction deformation and high reliability interconnect union. In addition, deforming the interconnect structure around the conductive trace mechanically locks the bump to the trace to prevent die shifting or die floating during reflow.

FIGS. 17a-17c show a mold underfill (MUF) process to deposit encapsulant around the bumps between the semiconductor die and substrate. FIG. 17a shows semiconductor die 224 mounted to substrate 254 using bump material 234 from FIG. 12b and placed between upper mold support 316 and lower mold support 318 of chase mold 320. The other semiconductor die and substrate combinations from FIGS. 12a-12g, 13a-13d, 14a-14d, 15a-15c, and 16a-16b can be placed between upper mold support 316 and lower mold support 318 of chase mold 320. The upper mold support 316 includes compressible releasing film 322.

In FIG. 17b, upper mold support 316 and lower mold support 318 are brought together to enclose semiconductor die 224 and substrate 254 with an open space over the substrate and between the semiconductor die and substrate. Compressible releasing film 322 conforms to back surface 228 and side surface of semiconductor die 224 to block formation of encapsulant on these surfaces. An encapsulant 324 in a liquid state is injected into one side of chase mold 320 with nozzle 326 while an optional vacuum assist 328 draws pressure from the opposite side to uniformly fill the open space over substrate 254 and the open space between semiconductor die 224 and substrate 254 with the encapsulant. Encapsulant 324 can be polymer composite material, such as epoxy resin with filler, epoxy acrylate with filler, or polymer with proper filler. Encapsulant 324 is non-conductive and environmentally protects the semiconductor device from external elements and contaminants. Compressible material 322 prevents encapsulant 324 from flowing over back surface 228 and around the side surface of semiconductor die 224. Encapsulant 324 is cured. The back surface 228 and side surface of semiconductor die 224 remain exposed from encapsulant 324.

FIG. 17c shows an embodiment of MUF and mold overfill (MOF), i.e., without compressible material 322. Semiconductor die 224 and substrate 254 are placed between upper mold support 316 and lower mold support 318 of chase mold 320. The upper mold support 316 and lower mold support 318 are brought together to enclose semiconductor die 224 and substrate 254 with an open space over the substrate, around the semiconductor die, and between the semiconductor die and substrate. Encapsulant 324 in a liquid state is injected into one side of chase mold 320 with nozzle 326 while an optional vacuum assist 328 draws pressure from the opposite side to uniformly fill the open space around semiconductor die 224 and over substrate 254 and the open space between semiconductor die 224 and substrate 254 with the encapsulant. Encapsulant 324 is cured.

FIG. 18 shows another embodiment of depositing encapsulant around semiconductor die 224 and in the gap between semiconductor die 224 and substrate 254. Semiconductor die 224 and substrate 254 are enclosed by dam 330. Encapsulant 332 is dispensed from nozzles 334 in a liquid state into dam 330 to fill the open space over substrate 254 and the open space between semiconductor die 224 and substrate 254. The volume of encapsulant 332 dispensed from nozzles 334 is controlled to fill dam 330 without covering back surface 228 or the side surface of semiconductor die 224. Encapsulant 332 is cured.

Figure 19:
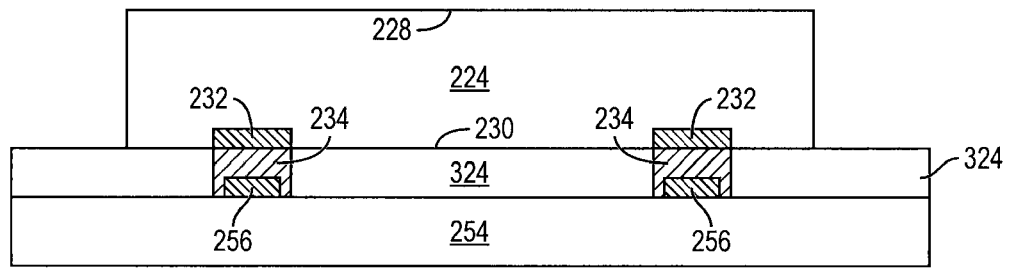
FIG. 19 illustrates the semiconductor die and substrate after mold underfill.

FIG. 19 shows semiconductor die 224 and substrate 254 after the MUF process from FIGS. 17a, 17c, and 18. Encapsulant 324 is uniformly distributed over substrate 254 and around bump material 234 between semiconductor die 224 and substrate 254.

Figure 20A:
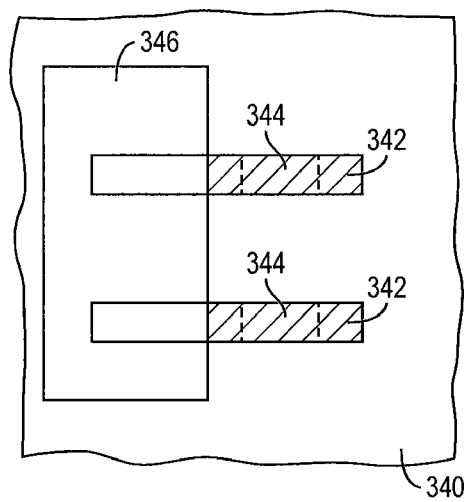
FIGS. 20a-20g illustrate various arrangements of the conductive traces with open solder registration.

FIGS. 20a-20g show top views of various conductive trace layouts on substrate or PCB 340. In FIG. 20a, conductive trace 342 is a straight conductor with integrated bump pad or interconnect site 344 formed on substrate 340. The sides of substrate bump pad 344 can be co-linear with conductive trace 342. In the prior art, a solder registration opening (SRO) is typically formed over the interconnect site to contain the bump material during reflow. The SRO increases interconnect pitch and reduces I/O count. In contrast, masking layer 346 can be formed over a portion of substrate 340; however, the masking layer is not formed around substrate bump pad 344 of conductive trace 342. That is, the portion of conductive trace 342 designed to mate with the bump material is devoid of any SRO of masking layer 346 that would have been used for bump containment during reflow.

Semiconductor die 224 is placed over substrate 340 and the bump material is aligned with substrate bump pads 344. The bump material is electrically and metallurgically connected to substrate bump pads 344 by bringing the bump material in physical contact with the bump pad and then reflowing the bump material under a reflow temperature.

Figure 20B:
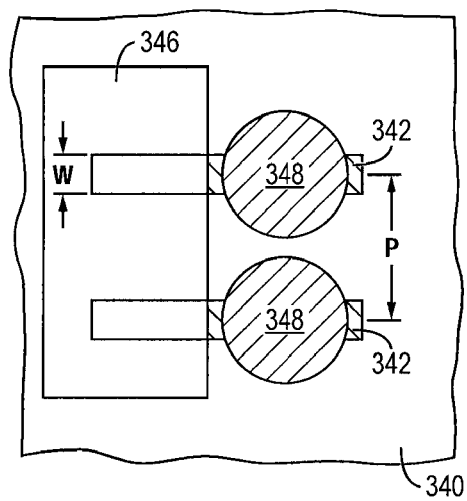

In another embodiment, an electrically conductive bump material is deposited over substrate bump pad 344 using an evaporation, electrolytic plating, electroless plating, ball drop, or screen printing process. The bump material can be Al, Sn, Ni, Au, Ag, Pb, Bi, Cu, solder, and combinations thereof, with an optional flux solution. For example, the bump material can be eutectic Sn/Pb, high-lead solder, or lead-free solder. The bump material is bonded to substrate bump pad 344 using a suitable attachment or bonding process. In one embodiment, the bump material is reflowed by heating the material above its melting point to form bump or interconnect 348, as shown in FIG. 20b. In some applications, bump 348 is reflowed a second time to improve electrical contact to substrate bump pad 344. The bump material around the narrow substrate bump pad 344 maintains die placement during reflow.

In high routing density applications, it is desirable to minimize escape pitch of conductive traces 342. The escape pitch between conductive traces 342 can be reduced by eliminating the masking layer for the purpose of reflow containment, i.e., by reflowing the bump material without a masking layer. Since no SRO is formed around die bump pad 232 or substrate bump pad 344, conductive traces 342 can be formed with a finer pitch, i.e., conductive trace 342 can be disposed closer together or to nearby structures. With no SRO around substrate bump pad 344, the pitch between conductive traces 342 is given as $P=D+PLT+W/2$, wherein D is the base diameter of bump 348, PLT is die placement tolerance, and W is the width of conductive trace 342. In one embodiment, given a bump base diameter of 100 μm, PLT of 10 μm, and trace line width of 30 μm, the minimum escape pitch of conductive trace 342 is 125 μm. The mask-less bump formation eliminates the need to account for the ligament spacing of masking material between adjacent openings, solder mask registration tolerance (SRT), and minimum resolvable SRO, as found in the prior art.

When the bump material is reflowed without a masking layer to metallurgically and electrically connect die bump pad 232 to substrate bump pad 344, the wetting and surface tension causes the bump material to maintain self-confinement and be retained within the space between die bump pad 232 and substrate bump pad 344 and portion of substrate 340 immediately adjacent to conductive trace 342 substantially within the footprint of the bump pads.

To achieve the desired self-confinement property, the bump material can be immersed in a flux solution prior to placement on die bump pad 232 or substrate bump pad 344 to selectively render the region contacted by the bump material more wettable than the surrounding area of conductive traces 342. The molten bump material remains confined substantially within the area defined by the bump pads due to the wettable properties of the flux solution. The bump material does not run-out to the less wettable areas. A thin oxide layer or other insulating layer can be formed over areas where bump material is not intended to make the area less wettable. Hence, masking layer 340 is not needed around die bump pad 232 or substrate bump pad 344.

Figure 20C:
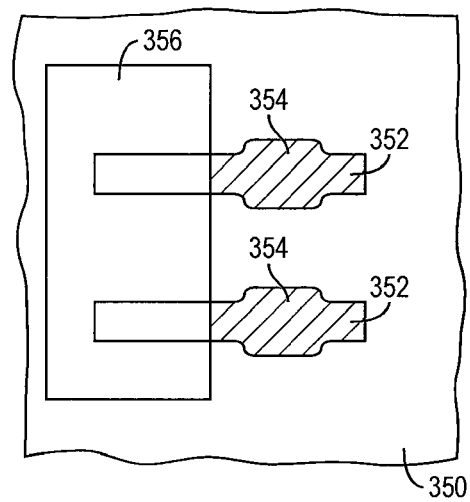

FIG. 20c shows another embodiment of parallel conductive traces 352 as a straight conductor with integrated rectangular bump pad or interconnect site 354 formed on substrate 350. In this case, substrate bump pad 354 is wider than conductive trace 352, but less than the width of the mating bump. The sides of substrate bump pad 354 can be parallel to conductive trace 352. Masking layer 356 can be formed over a portion of substrate 350; however, the masking layer is not formed around substrate bump pad 354 of conductive trace 352. That is, the portion of conductive trace 352 designed to mate with the bump material is devoid of any SRO of masking layer 356 that would have been used for bump containment during reflow.

Figure 20D:
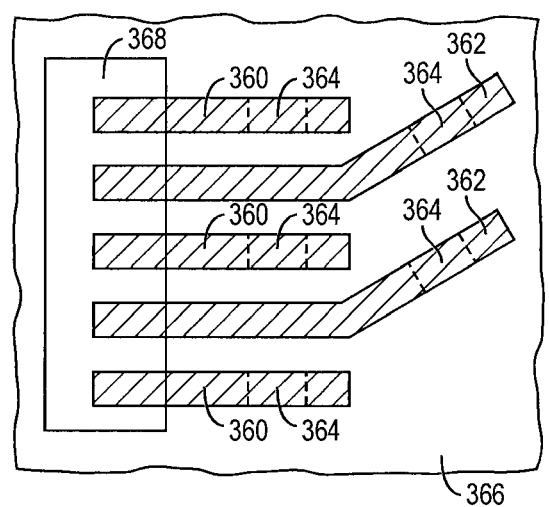

FIG. 20d shows another embodiment of conductive traces 360 and 362 arranged in an array of multiple rows with offset integrated bump pad or interconnect site 364 formed on substrate 366 for maximum interconnect escape routing density and capacity. Alternate conductive traces 360 and 362 include an elbow for routing to bump pads 364. The sides of each substrate bump pad 364 is co-linear with conductive traces 360 and 362. Masking layer 368 can be formed over a portion of substrate 366; however, masking layer 368 is not formed around substrate bump pad 364 of conductive traces 360 and 362. That is, the portion of conductive trace 360 and 362 designed to mate with the bump material is devoid of any SRO of masking layer 368 that would have been used for bump containment during reflow.

Figure 20E:
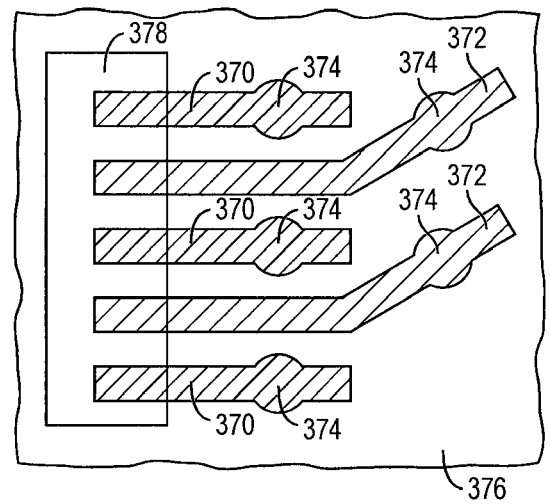

FIG. 20e shows another embodiment of conductive traces 370 and 372 arranged in an array of multiple rows with offset integrated bump pad or interconnect site 374 formed on substrate 376 for maximum interconnect escape routing density and capacity. Alternate conductive traces 370 and 372 include an elbow for routing to bump pads 374. In this case, substrate bump pad 374 is rounded and wider than conductive traces 370 and 372, but less than the width of the mating interconnect bump material. Masking layer 378 can be formed over a portion of substrate 376; however, masking layer 378 is not formed around substrate bump pad 374 of conductive traces 370 and 372. That is, the portion of conductive trace 370 and 372 designed to mate with the bump material is devoid of any SRO of masking layer 378 that would have been used for bump containment during reflow.

Figure 20F:
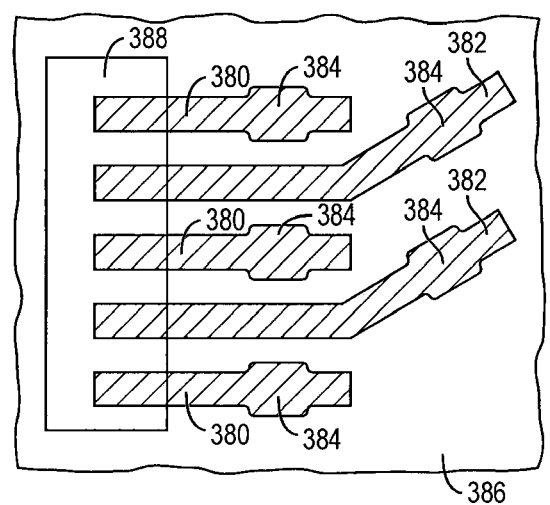

FIG. 20f shows another embodiment of conductive traces 380 and 382 arranged in an array of multiple rows with offset integrated bump pad or interconnect site 384 formed on substrate 386 for maximum interconnect escape routing density and capacity. Alternate conductive traces 380 and 382 include an elbow for routing to bump pads 384. In this case, substrate bump pad 384 is rectangular and wider than conductive traces 380 and 382, but less than the width of the mating interconnect bump material. Masking layer 388 can be formed over a portion of substrate 386; however, masking layer 388 is not formed around substrate bump pad 384 of conductive traces 380 and 382. That is, the portion of conductive trace 380 and 382 designed to mate with the bump material is devoid of any SRO of masking layer 388 that would have been used for bump containment during reflow.

As one example of the interconnect process, semiconductor die 224 is placed over substrate 366 and bump material 234 is aligned with substrate bump pads 364 from FIG. 20d. Bump material 234 is electrically and metallurgically connected to substrate bump pad 364 by pressing the bump material or by bringing the bump material in physical contact with the bump pad and then reflowing the bump material under a reflow temperature, as described for FIGS. 12a-12g, 13a-13d, 14a-14d, 15a-15c, and 16a-16b.

Figure 20G:
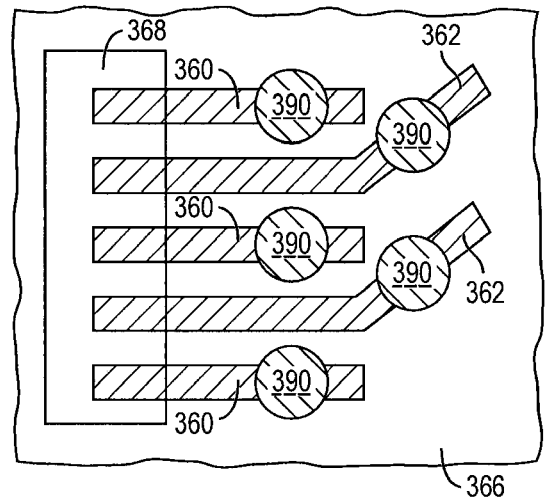

In another embodiment, an electrically conductive bump material is deposited over substrate bump pad 364 using an evaporation, electrolytic plating, electroless plating, ball drop, or screen printing process. The bump material can be Al, Sn, Ni, Au, Ag, Pb, Bi, Cu, solder, and combinations thereof, with an optional flux solution. For example, the bump material can be eutectic Sn/Pb, high-lead solder, or lead-free solder. The bump material is bonded to substrate bump pad 364 using a suitable attachment or bonding process. In one embodiment, the bump material is reflowed by heating the material above its melting point to form bump or interconnect 390, as shown in FIG. 20g. In some applications, bump 390 is reflowed a second time to improve electrical contact to substrate bump pad 364. The bump material around the narrow substrate bump pad 364 maintains die placement during reflow. Bump material 234 or bumps 390 can also be formed on substrate bump pad configurations of FIGS. 20a-20g.

In high routing density applications, it is desirable to minimize escape pitch of conductive traces 360 and 362 or other conductive trace configurations of FIGS. 20a-20g. The escape pitch between conductive traces 360 and 362 can be reduced by eliminating the masking layer for the purpose of reflow containment, i.e., by reflowing the bump material without a masking layer. Since no SRO is formed around die bump pad 232 or substrate bump pad 364, conductive traces 360 and 362 can be formed with a finer pitch, i.e., conductive traces 360 and 362 can be disposed closer together or to nearby structures. With no SRO around substrate bump pad 364, the pitch between conductive traces 360 and 362 is given as $P=D/2+PLT+W/2$, wherein D is the base diameter of bump 390, PLT is die placement tolerance, and W is the width of conductive traces 360 and 362. In one embodiment, given a bump base diameter of 100 μm, PLT of 10 μm, and trace line width of 30 μm, the minimum escape pitch of conductive traces 360 and 362 is 125 μm. The mask-less bump formation eliminates the need to account for the ligament spacing of masking material between adjacent openings, SRT, and minimum resolvable SRO, as found in the prior art.

When the bump material is reflowed without a masking layer to metallurgically and electrically connect die bump pad 232 to substrate bump pad 364, the wetting and surface tension causes the bump material to maintain self-confinement and be retained within the space between die bump pad 232 and substrate bump pad 364 and portion of substrate 366 immediately adjacent to conductive traces 360 and 362 substantially within the footprint of the bump pads.

To achieve the desired self-confinement property, the bump material can be immersed in a flux solution prior to placement on die bump pad 232 or substrate bump pad 364 to selectively render the region contacted by the bump material more wettable than the surrounding area of conductive traces 360 and 362. The molten bump material remains confined substantially within the area defined by the bump pads due to the wettable properties of the flux solution. The bump material does not run-out to the less wettable areas. A thin oxide layer or other insulating layer can be formed over areas where bump material is not intended to make the area less wettable. Hence, masking layer 368 is not needed around die bump pad 232 or substrate bump pad 364.

Figure 21A:
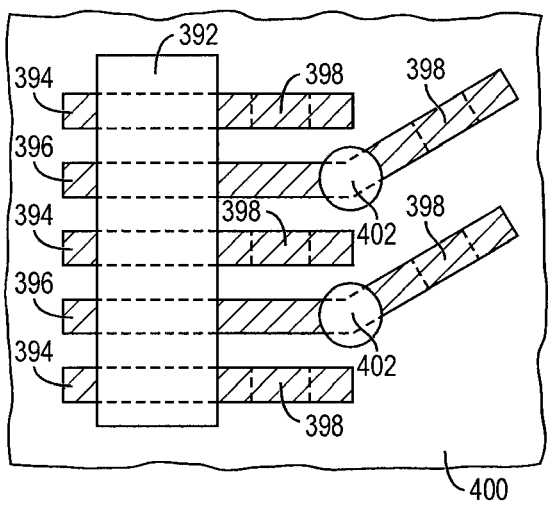
FIGS. 21a-21b illustrate the open solder registration with patches between the conductive traces.

In FIG. 21a, masking layer 392 is deposited over a portion of conductive traces 394 and 396. However, masking layer 392 is not formed over integrated bump pads 398. Consequently, there is no SRO for each bump pad 398 on substrate 400. A non-wettable masking patch 402 is formed on substrate 400 interstitially within the array of integrated bump pads 398, i.e., between adjacent bump pads. The masking patch 402 can also be formed on semiconductor die 224 interstitially within the array of die bump pads 398. More generally, the masking patch is formed in close proximity to the integrated bump pads in any arrangement to prevent runout to less wettable areas.

Semiconductor die 224 is placed over substrate 400 and the bump material is aligned with substrate bump pads 398. The bump material is electrically and metallurgically connected to substrate bump pad 398 by pressing the bump material or by bringing the bump material in physical contact with the bump pad and then reflowing the bump material under a reflow temperature, as described for FIGS. 12a-12g, 13a-13d, 14a-14d, 15a-15c, and 16a-16b.

Figure 21B:
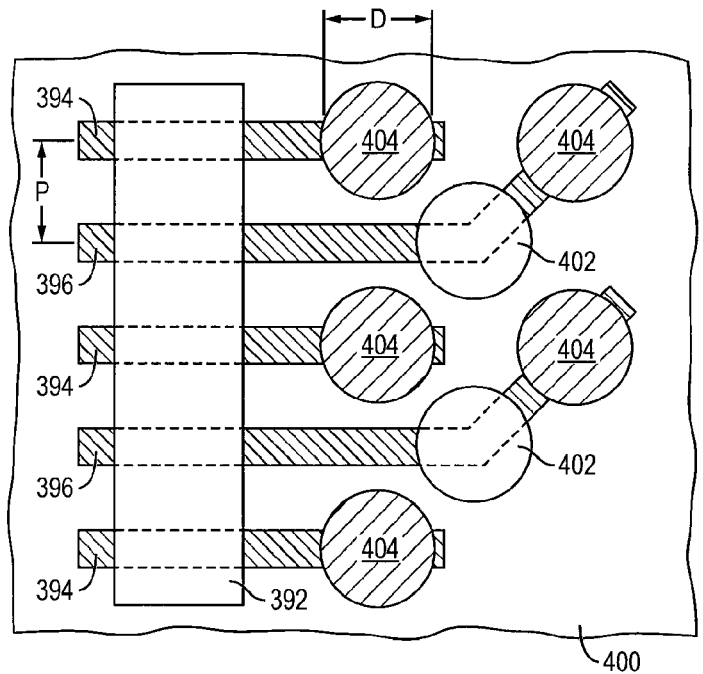

In another embodiment, an electrically conductive bump material is deposited over die integrated bump pads 398 using an evaporation, electrolytic plating, electroless plating, ball drop, or screen printing process. The bump material can be Al, Sn, Ni, Au, Ag, Pb, Bi, Cu, solder, and combinations thereof, with an optional flux solution. For example, the bump material can be eutectic Sn/Pb, high-lead solder, or lead-free solder. The bump material is bonded to integrated bump pads 398 using a suitable attachment or bonding process. In one embodiment, the bump material is reflowed by heating the material above its melting point to form spherical balls or bumps 404, as shown in FIG. 21b. In some applications, bumps 404 are reflowed a second time to improve electrical contact to integrated bump pads 398. The bumps can also be compression bonded to integrated bump pads 398. Bumps 404 represent one type of interconnect structure that can be formed over integrated bump pads 398. The interconnect structure can also use stud bump, micro bump, or other electrical interconnect.

In high routing density applications, it is desirable to minimize escape pitch. In order to reduce the pitch between conductive traces 394 and 396, the bump material is reflowed without a masking layer around integrated bump pads 398. The escape pitch between conductive traces 394 and 396 can be reduced by eliminating the masking layer and associated SROs around the integrated bump pads for the purpose of reflow containment, i.e., by reflowing the bump material without a masking layer. Masking layer 392 can be formed over a portion of conductive traces 394 and 396 and substrate 400 away from integrated bump pads 398; however, masking layer 392 is not formed around integrated bump pads 398. That is, the portion of conductive trace 394 and 396 designed to mate with the bump material is devoid of any SRO of masking layer 392 that would have been used for bump containment during reflow.

In addition, masking patch 402 is formed on substrate 400 interstitially within the array of integrated bump pads 398. Masking patch 402 is non-wettable material. Masking patch 402 can be the same material as masking layer 392 and applied during the same processing step, or a different material during a different processing step. Masking patch 402 can be formed by selective oxidation, plating, or other treatment of the portion of the trace or pad within the array of integrated bump pads 398. Masking patch 402 confines bump material flow to integrated bump pads 398 and prevents leaching of conductive bump material to adjacent structures.

When the bump material is reflowed with masking patch 402 interstitially disposed within the array of integrated bump pads 398, the wetting and surface tension causes the bump material to be confined and retained within the space between die bump pads 232 and integrated bump pads 398 and portion of substrate 400 immediately adjacent to conductive traces 394 and 396 and substantially within the footprint of the integrated bump pads 398.

To achieve the desired confinement property, the bump material can be immersed in a flux solution prior to placement on die bump pads 232 or integrated bump pads 398 to selectively render the region contacted by the bump material more wettable than the surrounding area of conductive traces 394 and 396. The molten bump material remains confined substantially within the area defined by the bump pads due to the wettable properties of the flux solution. The bump material does not run-out to the less wettable areas. A thin oxide layer or other insulating layer can be formed over areas where bump material is not intended to make the area less wettable. Hence, masking layer 392 is not needed around die bump pads 232 or integrated bump pads 398.

Since no SRO is formed around die bump pads 232 or integrated bump pads 398, conductive traces 394 and 396 can be formed with a finer pitch, i.e., the conductive traces can be disposed closer to adjacent structures without making contact and forming electrical shorts. Assuming the same solder registration design rule, the pitch between conductive traces 394 and 396 is given as $P=(1.1D+W)/2$, where D is the base diameter of bump 404 and W is the width of conductive traces 394 and 396. In one embodiment, given a bump diameter of 100 μm and trace line width of 20 μm, the minimum escape pitch of conductive traces 394 and 396 is 65 μm. The bump formation eliminates the need to account for the ligament spacing of masking material between adjacent openings and minimum resolvable SRO, as found in the prior art.

Figure 22:
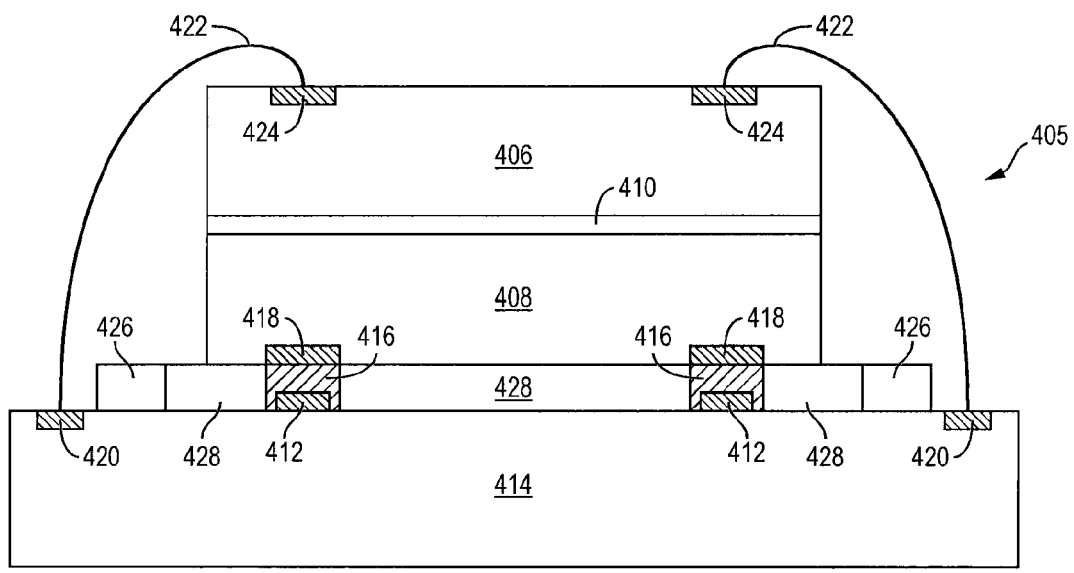
FIG. 22 illustrates a POP with masking layer dam to restrain the encapsulant during mold underfill.

FIG. 22 shows package-on-package (PoP) 405 with semiconductor die 406 stacked over semiconductor die 408 using die attach adhesive 410. Semiconductor die 406 and 408 each have an active surface containing analog or digital circuits implemented as active devices, passive devices, conductive layers, and dielectric layers formed within the die and electrically interconnected according to the electrical design and function of the die. For example, the circuit can include one or more transistors, diodes, and other circuit elements formed within the active surface to implement analog circuits or digital circuits, such as DSP, ASIC, memory, or other signal processing circuit. Semiconductor die 406 and 408 can also contain IPDs, such as inductors, capacitors, and resistors, for RF signal processing.

Semiconductor die 408 is mounted to conductive traces 412 formed on substrate 414 using bump material 416 formed on contact pads 418, using any of the embodiments from FIGS. 12a-12g, 13a-13d, 14a-14d, 15a-15c, and 16a-16b. Conductive traces 412 are applicable to the interconnect structure, as described in FIGS. 8-10. Semiconductor die 406 is electrically connected to contact pads 420 formed on substrate 414 using bond wires 422. The opposite end of bond wire 422 is bonded to contact pads 424 on semiconductor die 406.

Masking layer 426 is formed over substrate 414 and opened beyond the footprint of semiconductor die 406. While masking layer 426 does not confine bump material 416 to conductive traces 412 during reflow, the open mask can operate as a dam to prevent encapsulant 428 from migrating to contact pads 420 or bond wires 422 during MUF. Encapsulant 428 is deposited between semiconductor die 408 and substrate 414, similar to FIGS. 17a-17c. Masking layer 426 blocks MUF encapsulant 428 from reaching contact pads 420 and bond wires 422, which could cause a defect. Masking layer 426 allows a larger semiconductor die to be placed on a given substrate without risk of encapsulant 428 bleeding onto contact pads 420.

While one or more embodiments of the present invention have been illustrated in detail, the skilled artisan will appreciate that modifications and adaptations to those embodiments may be made without departing from the scope of the present invention as set forth in the following claims.

What is claimed:

1. A method of making a semiconductor device, comprising:
    providing a semiconductor die;
    providing a substrate;
    forming a plurality of conductive traces over the substrate, at least one of the conductive traces including a plurality of interconnect sites;
    forming a masking layer over the substrate, the masking layer including a plurality of elongated openings extending over at least two of the conductive traces;
    forming an elongated interconnect structure between the semiconductor die and a first interconnect site of the interconnect sites, wherein a length of the elongated interconnect structure along the first interconnect site is greater than a width of the elongated interconnect structure across the first interconnect site, and the width of the elongated interconnect structure is tapered along the length of the elongated interconnect structure to be wider proximate to the semiconductor die and narrower proximate to the first interconnect site; and
    depositing an encapsulant between the semiconductor die and substrate.

2. The method of claim 1, wherein the at least one of the plurality of conductive traces passes beneath at least two of the plurality of elongated openings.

3. The method of claim 1, wherein a length of each of the plurality of elongated openings is perpendicular to a length of each of the plurality of conductive traces.

4. The method of claim 1, wherein a width of each of the plurality of elongated openings is less than 90 micrometers.

5. The method of claim 1, wherein the elongated openings permit a flow of bump material along a length of the plurality of conductive traces within the elongated openings while preventing the flow of bump material past a boundary of the elongated openings.

6. The method of claim 1, wherein the elongated interconnect structure includes a fusible portion and non-fusible portion.

7. The method of claim 1, wherein the elongated interconnect structure includes a conductive pillar and bump formed over the conductive pillar.

8. A method of making a semiconductor device, comprising:
    providing a semiconductor die;
    providing a substrate;
    forming a plurality of conductive traces each including a plurality of interconnect sites over the substrate;
    forming a masking layer over the substrate, the masking layer including a plurality of elongated openings formed over at least two of the conductive traces; and
    forming an interconnect structure between the semiconductor die and a first interconnect site of the interconnect sites, wherein a length of the interconnect structure along the first interconnect site is greater than a width of the interconnect structure across the first interconnect site, and the width of the interconnect structure is tapered along the length of the interconnect structure to be wider proximate to the semiconductor die and narrower proximate to the first interconnect site.

9. The method of claim 8, further including depositing an encapsulant between the semiconductor die and substrate.

10. The method of claim 8, wherein one of the plurality of conductive traces passes beneath at least two of the plurality of elongated openings.

11. The method of claim 8, wherein a length of each of the plurality of elongated openings is perpendicular to a length of each of the plurality of conductive traces.

12. The method of claim 8, wherein a width of each of the plurality of elongated openings is less than 90 micrometers.

13. The method of claim 8, wherein the interconnect structure includes a fusible portion and non-fusible portion.

14. The method of claim 8, wherein the interconnect structure includes a conductive pillar and bump formed over the conductive pillar.

15. A semiconductor device, comprising:
    a semiconductor die;
    a substrate including first and second conductive traces comprising a plurality of interconnect sites formed over a surface of the substrate;
    a masking layer formed over the surface of the substrate, the masking layer including first and second elongated openings each formed over interconnect sites of the first and second conductive traces;
    an elongated interconnect structure formed between the semiconductor die and a first interconnect site of the interconnect sites and over a top surface and side surface of the first interconnect site, wherein a length of the elongated interconnect structure along the first interconnect site is greater than a width of the elongated interconnect structure across the first interconnect site, and the width of the elongated interconnect structure is tapered along the length of the elongated interconnect structure to be wider proximate to the semiconductor die and narrower proximate to the first interconnect site; and
    an encapsulant deposited between the semiconductor die and substrate.

16. The semiconductor device of claim 15, wherein the first and second conductive traces pass beneath the first and second elongated openings.

17. The semiconductor device of claim 15, wherein a length of the first and second elongated openings is perpendicular to a length of the first and second conductive traces.

18. The semiconductor device of claim 15, wherein the elongated interconnect structure includes a fusible portion and non-fusible portion.

19. The semiconductor device of claim 15, wherein the elongated interconnect structure includes a conductive pillar and bump formed over the conductive pillar.

20. A semiconductor device, comprising:
a semiconductor die;
a substrate;
a plurality of conductive traces formed over the substrate, a first conductive trace of the conductive traces including a plurality of interconnect sites;
a masking layer formed over the substrate, the masking layer including a plurality of elongated openings extending over at least two of the conductive traces;
an interconnect structure formed between the semiconductor die and a first interconnect site of the interconnect sites, wherein a length of the interconnect structure along the first interconnect site is greater than a width of the interconnect structure across the first interconnect site, and the width of the interconnect structure is tapered along the length of the interconnect structure to be wider proximate to the semiconductor die and narrower proximate to the first interconnect site; and
an encapsulant deposited between the semiconductor die and substrate.

21. The semiconductor device of claim 20, wherein at least one of the plurality of conductive traces passes beneath at least two of the plurality of elongated openings.

22. The semiconductor device of claim 20, wherein a length of each of the plurality of elongated openings is perpendicular to a length of each of the plurality of conductive traces.

23. The semiconductor device of claim 20, wherein a width of each of the plurality of elongated openings is less than 90 micrometers.

24. The semiconductor device of claim 20, wherein the elongated openings permit a flow of bump material along a length of the plurality of conductive traces within the elongated openings while preventing the flow of bump material past a boundary of the elongated openings.

25. The semiconductor device of claim 20, wherein the interconnect structure includes a fusible portion and non-fusible portion.

26. A semiconductor device, comprising:
a semiconductor die;
a substrate;
a plurality of conductive traces each including a plurality of interconnect sites formed over the substrate;
a masking layer formed over the substrate, the masking layer including a plurality of elongated openings formed over at least two of the conductive traces; and
an interconnect structure formed between the semiconductor die and a first interconnect site of the interconnect sites, wherein a length of the interconnect structure along the first interconnect site is greater than a width of the interconnect structure across the first interconnect site, and the width of the interconnect structure is tapered along the length of the interconnect structure to be wider proximate to the semiconductor die and narrower proximate to the first interconnect site.

27. The semiconductor device of claim 26, further including an encapsulant deposited around the interconnect structure.

28. The semiconductor device of claim 26, wherein one of the plurality of conductive traces passes beneath at least two of the plurality of elongated openings.

29. The semiconductor device of claim 26, wherein a length of each of the plurality of elongated openings is perpendicular to a length of each of the plurality of conductive traces.

30. The semiconductor device of claim 26, wherein the interconnect structure includes a conductive pillar and bump formed over the conductive pillar.

* * * * *